United States Patent
Endo

(10) Patent No.: US 9,608,005 B2
(45) Date of Patent: Mar. 28, 2017

(54) MEMORY CIRCUIT INCLUDING OXIDE SEMICONDUCTOR DEVICES

(71) Applicant: SEMICONDUCTOR ENERGY LABORATORY CO., LTD., Atsugi-shi, Kanagawa-ken (JP)

(72) Inventor: Masami Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 2 days.

(21) Appl. No.: 14/461,564

(22) Filed: Aug. 18, 2014

(65) Prior Publication Data

US 2015/0048362 A1   Feb. 19, 2015

(30) Foreign Application Priority Data

Aug. 19, 2013   (JP) .................. 2013-169830

(51) Int. Cl.
    *H01L 29/04*     (2006.01)
    *H01L 27/12*     (2006.01)

(52) U.S. Cl.
    CPC ................ *H01L 27/1225* (2013.01)

(58) Field of Classification Search
    CPC .................................. H01L 27/1225
    USPC ........................................... 257/43
    See application file for complete search history.

(56) References Cited

U.S. PATENT DOCUMENTS

| | | |
|---|---|---|
| 4,656,607 A | 4/1987 | Hagiwara et al. |
| 4,797,576 A | 1/1989 | Asazawa |
| 4,809,225 A | 2/1989 | Dimmler et al. |
| 5,218,607 A | 6/1993 | Saito et al. |
| 5,731,856 A | 3/1998 | Kim et al. |
| 5,744,864 A | 4/1998 | Cillessen et al. |
| 5,936,879 A | 8/1999 | Brouwer et al. |
| 6,046,606 A | 4/2000 | Chu et al. |

(Continued)

FOREIGN PATENT DOCUMENTS

| | | |
|---|---|---|
| EP | 0135036 A | 3/1985 |
| EP | 0297777 A | 1/1989 |

(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, AGNE GIJUTSU Center.

(Continued)

*Primary Examiner* — Matthew Gordon
(74) *Attorney, Agent, or Firm* — Fish & Richardson P.C.

(57) ABSTRACT

To provide a semiconductor device with excellent charge retention characteristics, an OS transistor is used as a transistor whose gate is connected to a node for retaining charge. Charge is stored in a first capacitor, and data at the node for retaining charge is read based on whether the stored charge is transferred to a second capacitor. Since a Si transistor, in which leakage current through a gate insulating film occurs, is not used as a transistor connected to the node for retaining charge, charge retention characteristics of the node are improved. In addition, the semiconductor device operates in data reading without requiring transistor performance equivalent to that of a Si transistor.

16 Claims, 24 Drawing Sheets

(56) References Cited

U.S. PATENT DOCUMENTS

| | | |
|---|---|---|
| 6,127,702 A | 10/2000 | Yamazaki et al. |
| 6,294,274 B1 | 9/2001 | Kawazoe et al. |
| 6,385,120 B1 | 5/2002 | Steiss |
| 6,563,174 B2 | 5/2003 | Kawasaki et al. |
| 6,576,943 B1 | 6/2003 | Ishii et al. |
| 6,727,522 B1 | 4/2004 | Kawasaki et al. |
| 6,738,281 B2 | 5/2004 | Yokozeki |
| 6,788,567 B2 | 9/2004 | Fujimori |
| 6,809,952 B2 | 10/2004 | Masui |
| 6,845,032 B2 | 1/2005 | Toyoda et al. |
| 6,876,023 B2 | 4/2005 | Ishii et al. |
| 6,934,178 B2 | 8/2005 | Yokozeki et al. |
| 6,944,045 B2 | 9/2005 | Fujimori |
| 6,972,986 B2 | 12/2005 | Peng et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,612,594 B2 | 11/2009 | Fukuoka |
| 7,616,040 B2 | 11/2009 | Motomura |
| 7,674,650 B2 | 3/2010 | Akimoto et al. |
| 7,732,819 B2 | 6/2010 | Akimoto et al. |
| 7,847,287 B2 | 12/2010 | Kim et al. |
| 7,863,611 B2 | 1/2011 | Abe et al. |
| 7,863,627 B2 | 1/2011 | Honda |
| 7,910,490 B2 | 3/2011 | Akimoto et al. |
| 7,932,521 B2 | 4/2011 | Akimoto et al. |
| 7,940,085 B2 | 5/2011 | Kim et al. |
| 8,085,076 B2 | 12/2011 | Djaja et al. |
| 8,115,201 B2 | 2/2012 | Yamazaki et al. |
| 8,158,987 B2 | 4/2012 | Nabekura et al. |
| 8,217,680 B2 | 7/2012 | Kim et al. |
| 8,274,077 B2 | 9/2012 | Akimoto et al. |
| 8,362,478 B2 | 1/2013 | Yamazaki et al. |
| 2001/0046027 A1 | 11/2001 | Tai et al. |
| 2002/0056838 A1 | 5/2002 | Ogawa |
| 2002/0074568 A1 | 6/2002 | Yoshida et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0071039 A1 | 4/2004 | Fujimori |
| 2004/0127038 A1 | 7/2004 | Carcia et al. |
| 2004/0164778 A1 | 8/2004 | Toyoda et al. |
| 2005/0017302 A1 | 1/2005 | Hoffman |
| 2005/0169039 A1 | 8/2005 | Peng et al. |
| 2005/0169040 A1 | 8/2005 | Peng et al. |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0095975 A1 | 5/2006 | Yamada et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0019460 A1 | 1/2007 | Kang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126666 A1 | 6/2007 | Yamazaki et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0223275 A1 | 9/2007 | Nakajima et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0197414 A1 | 8/2008 | Hoffman et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0002044 A1 | 1/2009 | Kobayashi |
| 2009/0002590 A1 | 1/2009 | Kimura |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0019839 A1 | 1/2010 | Monden |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0148171 A1 | 6/2010 | Hayashi et al. |
| 2010/0193785 A1 | 8/2010 | Kimura |
| 2010/0200851 A1 | 8/2010 | Oikawa et al. |
| 2010/0252832 A1 | 10/2010 | Asano et al. |
| 2011/0010493 A1 | 1/2011 | Kimura et al. |
| 2011/0024741 A1 | 2/2011 | Abe et al. |
| 2011/0089417 A1 | 4/2011 | Yamazaki et al. |
| 2011/0101351 A1 | 5/2011 | Yamazaki |
| 2011/0104851 A1 | 5/2011 | Akimoto et al. |
| 2011/0117697 A1 | 5/2011 | Akimoto et al. |

(56) References Cited

U.S. PATENT DOCUMENTS

| | | | |
|---|---|---|---|
| 2011/0121290 A1 | 5/2011 | Akimoto et al. | |
| 2011/0121878 A1 | 5/2011 | Kato et al. | |
| 2011/0148463 A1 | 6/2011 | Kato et al. | |
| 2011/0156024 A1 | 6/2011 | Koyama et al. | |
| 2011/0163311 A1 | 7/2011 | Akimoto et al. | |
| 2011/0176357 A1 | 7/2011 | Koyama et al. | |
| 2011/0187410 A1 | 8/2011 | Kato et al. | |
| 2012/0051117 A1 | 3/2012 | Yamazaki et al. | |
| 2012/0132910 A1 | 5/2012 | Yamazaki et al. | |
| 2012/0170355 A1* | 7/2012 | Ohmaru | G11C 11/24 365/149 |
| 2012/0195115 A1 | 8/2012 | Fujita et al. | |
| 2012/0195122 A1 | 8/2012 | Ohmaru | |
| 2012/0230138 A1* | 9/2012 | Endo | G11C 19/184 365/203 |
| 2012/0250407 A1 | 10/2012 | Kurokawa | |
| 2012/0274378 A1 | 11/2012 | Fujita | |
| 2013/0057315 A1 | 3/2013 | Kato et al. | |
| 2013/0262828 A1 | 10/2013 | Yoneda | |
| 2014/0003146 A1 | 1/2014 | Yoneda et al. | |
| 2014/0009199 A1 | 1/2014 | Ohmaru et al. | |
| 2014/0204696 A1 | 7/2014 | Kato et al. | |
| 2014/0269014 A1 | 9/2014 | Ohmaru | |
| 2014/0293711 A1 | 10/2014 | Kato et al. | |
| 2014/0325171 A1 | 10/2014 | Yoneda | |

FOREIGN PATENT DOCUMENTS

| | | |
|---|---|---|
| EP | 0404061 A | 12/1990 |
| EP | 0530928 A | 3/1993 |
| EP | 0818891 A | 1/1998 |
| EP | 0936546 A | 8/1999 |
| EP | 1447909 A | 8/2004 |
| EP | 1583239 A | 10/2005 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 58-205226 A | 11/1983 |
| JP | 60-025269 A | 2/1985 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-066899 A | 3/1989 |
| JP | 03-027419 A | 2/1991 |
| JP | 03-192915 A | 8/1991 |
| JP | 05-110392 A | 4/1993 |
| JP | 05-251705 A | 9/1993 |
| JP | 07-147530 A | 6/1995 |
| JP | 08-264794 A | 10/1996 |
| JP | 10-078836 A | 3/1998 |
| JP | 10-093423 A | 4/1998 |
| JP | 11-505377 | 5/1999 |
| JP | 11-261406 A | 9/1999 |
| JP | 2000-044236 A | 2/2000 |
| JP | 2000-077982 A | 3/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-269616 A | 9/2005 |
| JP | 2005-323295 A | 11/2005 |
| JP | 2006-050208 A | 2/2006 |
| JP | 2006-165532 A | 6/2006 |
| JP | 2007-096055 A | 4/2007 |
| JP | 2007-123861 A | 5/2007 |
| JP | 2007-125823 A | 5/2007 |
| JP | 2007-179021 A | 7/2007 |
| JP | 2008-052847 A | 3/2008 |
| JP | 2008-147903 A | 6/2008 |
| JP | 2009-175716 A | 8/2009 |
| JP | 2009-206942 A | 9/2009 |
| JP | 2009-212443 A | 9/2009 |
| JP | 2009-260378 A | 11/2009 |
| JP | 2010-034710 A | 2/2010 |
| JP | 2010-062229 A | 3/2010 |
| JP | 2010-062546 A | 3/2010 |
| JP | 2010-258434 A | 11/2010 |
| JP | 2010-267955 A | 11/2010 |
| JP | 2013-009297 | 1/2013 |
| WO | WO-03/044953 | 5/2003 |
| WO | WO-2004/059838 | 7/2004 |
| WO | WO-2004/114391 | 12/2004 |
| WO | WO-2009/110623 | 9/2009 |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 1, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Yamazaki.S et al., "Research, Development, and Application of Crystalline Oxide Semiconductor", SID Digest '12 : SID International Symposium Digest of Technical Papers, Jun. 5, 2012, pp. 183-186.

Nishijima.T et al., "Low-power Display System Driven by Utilizing Technique Using Crystalline IGZO Transistor", SID Digest '12 : SID International Symposium Digest of Technical Papers, 2012, pp. 583-586.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the

(56) References Cited

OTHER PUBLICATIONS

In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17 22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—Zn) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

MEMORY CIRCUIT INCLUDING OXIDE SEMICONDUCTOR DEVICES

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. One embodiment of the present invention relates to a semiconductor device, particularly to a semiconductor device using an oxide semiconductor.

2. Description of the Related Art

Much attention has been focused on a semiconductor device that retains data by using a combination of a transistor in which silicon (Si) is used for a semiconductor layer including a channel formation region (Si transistor) and a transistor in which an oxide semiconductor (OS) is used for a semiconductor layer including a channel formation region (OS transistor) (see Patent Document 1).

REFERENCE

Patent Document 1: Japanese Published Patent Application No. 2013-009297

SUMMARY OF THE INVENTION

Downsizing of Si transistors is effective in improving the performance of a semiconductor device. However, downsizing of Si transistors results in thinner gate insulating films, thereby posing a problem of leakage current through a gate insulating film.

For this reason, when a node for retaining charge is connected to a gate of a Si transistor as in the above semiconductor device, charge accumulated at the node leaks through a gate insulating film of the Si transistor. Thus, charge retention characteristics of the node deteriorate even when the off-state leakage current of the OS transistor (off-state current) is low.

In view of the above, an object of one embodiment of the present invention is to provide a novel-structured semiconductor device with excellent charge retention characteristics of a node for retaining charge. Another object of one embodiment of the present invention is to provide a novel-structured semiconductor device in which a transistor used instead of a Si transistor does not degrade the transistor performance. Another object of one embodiment of the present invention is to provide a novel-structured semiconductor device that has high area efficiency by preventing an increase in circuit area due to the increase in the number of components. Another object of one embodiment of the present invention is to provide a semiconductor device with a novel structure.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a semiconductor device including a first memory circuit that stores data at a first node and a second node, and a second memory circuit including a third node that stores the data. The second memory circuit includes a first transistor that supplies a potential of the data to the third node when the data is written; a second transistor including a gate supplied with the potential held at the third node; a third transistor that charges a first capacitor connected to one of a source and a drain of the third transistor when the data is not read; and a fourth transistor that distributes charge stored in the first capacitor to a second capacitor, when the data is read. When the data is read, the second transistor makes a potential held in the second capacitor a potential obtained by inverting logic of the data, in accordance with the potential of the third node. Each of the first transistor and the second transistor contains an oxide semiconductor in a semiconductor layer including a channel formation region.

In the semiconductor device of one embodiment of the present invention, each of the third transistor and the fourth transistor preferably contains silicon in a semiconductor layer including a channel formation region.

In the semiconductor device of one embodiment of the present invention, the first transistor and the second transistor are preferably stacked over the third transistor and the fourth transistor.

In the semiconductor device of one embodiment of the present invention, the second transistor is preferably connected to a fifth transistor containing silicon in a semiconductor layer including a channel formation region, to form a Darlington pair.

In the semiconductor device of one embodiment of the present invention, each of the first transistor and the second transistor preferably includes a backgate electrode.

In the semiconductor device of one embodiment of the present invention, a transistor that supplies a potential for initializing the potential held in the second capacitor is preferably electrically connected to one of electrodes of the second capacitor.

In the semiconductor device of one embodiment of the present invention, the capacitance of the first capacitor is preferably larger than that of the second capacitor.

In the semiconductor device of one embodiment of the present invention, the thickness of a gate insulating film of the second transistor is larger than that of a gate insulating film of the third transistor and the fourth transistor.

The semiconductor device of one embodiment of the present invention preferably includes an inverter circuit that inverts the potential held in the second capacitor and supplies the inverted potential to the second node.

One embodiment of the present invention can provide a novel-structured semiconductor device with excellent charge retention characteristics of a node for retaining charge. One embodiment of the present invention can provide a novel-structured semiconductor device in which a transistor used instead of a Si transistor does not degrade the transistor performance. Furthermore, one embodiment of the present invention can provide a novel-structured semiconductor device that has high area efficiency by preventing an increase in circuit area due to the increase in the number of components.

BRIEF DESCRIPTION OF THE DRAWINGS

In the accompanying drawings.

DETAILED DESCRIPTION OF THE INVENTION

Figure 1:
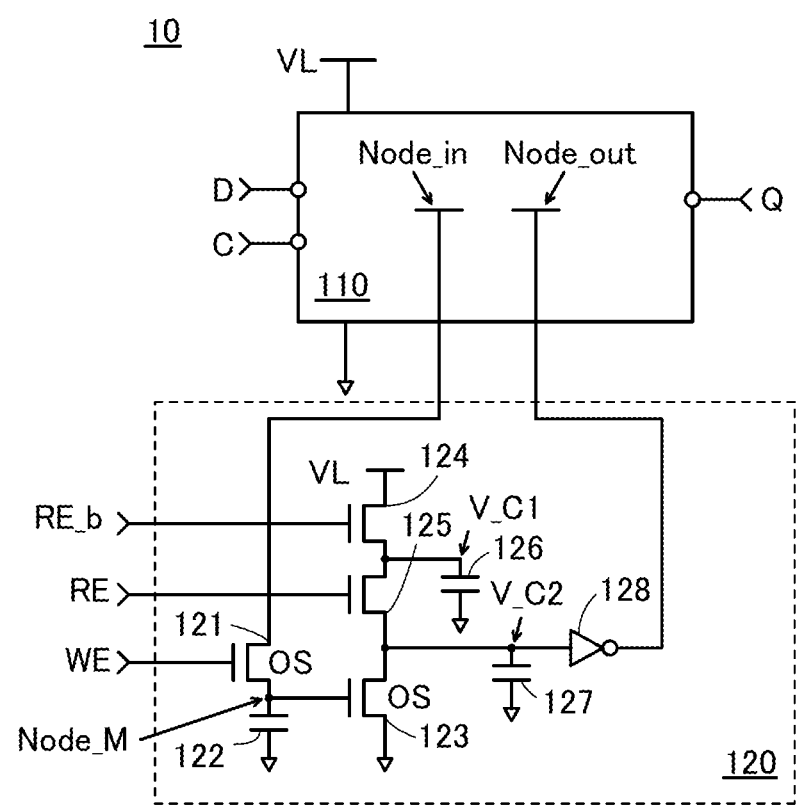
FIG. 1 is a circuit diagram of one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification and the like, ordinal numbers such as first, second, and third are used to avoid confusion among components, and thus do not limit the number of the components.

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

In this specification and the like, terms for explaining arrangement, such as over and under, are used for convenience to describe the positional relation between components with reference to drawings. Furthermore, the positional relation between components is changed as appropriate in accordance with a direction in which each component is described. Thus, there is no limitation on terms used in this specification, and description can be made as appropriate depending on the situation.

In this specification and the like, the layout of circuit blocks in a drawing specifies the positional relation for description. Thus, even when a drawing shows that different functions are achieved in different circuit blocks, an actual circuit block may be configured so that the different functions are achieved in the same circuit or region. In addition, the function of each circuit block in a drawing is specified for description. Thus, even when one circuit block is illustrated, an actual circuit or region may be configured so that processing which is shown as being performed in the one circuit block is performed in a plurality of circuit blocks.

In this specification and the like, voltage often refers to a difference between a given potential and a reference potential (e.g., a ground potential). Accordingly, voltage, potential, and potential difference can also be referred to as potential, voltage, and voltage difference, respectively. Note that voltage refers to a difference between potentials of two points, and potential refers to electrostatic energy (electric potential energy) of a unit charge at a given point in an electrostatic field.

In this specification and the like, the term "parallel" indicates that the angle formed between two straight lines ranges from −10° to 10°, and accordingly also includes the case where the angle ranges from −5° to 5°. The term "perpendicular" indicates that the angle formed between two straight lines ranges from 80° to 100°, and accordingly also includes the case where the angle ranges from 85° to 95°.

In this specification and the like, the trigonal and rhombohedral crystal systems are included in the hexagonal crystal system.

Embodiment 1

In this embodiment, a circuit structure and operation of a semiconductor device will be described.

Note that a semiconductor device refers to a device including a semiconductor element. The semiconductor device includes a driver circuit for driving a circuit including a semiconductor element, for example. Note that the semiconductor device may include a driver circuit, a power supply circuit, or the like provided over another substrate.

FIG. 1 is a circuit diagram illustrating an example of a semiconductor device 10 capable of storing 1-bit data. Note that in reality, a plurality of semiconductor devices connected are provided.

The semiconductor device 10 illustrated in FIG. 1 includes a memory circuit 110 and a memory circuit 120.

The memory circuit 110 includes a node Node_in and a node Node_out that are capable of holding a potential corresponding to data "1" or data "0" as data while the power supply voltage is applied. The memory circuit 110 is supplied with the power supply voltage based on a high power supply potential VDD supplied to a power supply line VL and a ground potential supplied to a ground line as a low power supply potential. Note that the memory circuit 110 may be referred to as a first memory circuit.

Note that in general, a potential and a voltage are relative values; therefore, a ground potential is not always 0 V.

Data held at the node Node_in and the node Node_out is 1-bit data. For example, an L-level potential is stored as data "0" and an H-level potential is stored as data "1".

Potentials held at the node Node_in and the node Node_out are to maintain data with the same potential. The node Node_in and the node Node_out may be the same node. When the node Node_in and the node Node_out are different nodes, one of them is supplied with inverted data.

While the power supply voltage is applied, data held at the node Node_in and the node Node_out is changed by data D and a clock signal C that are input to the memory circuit 110. The potentials held at the node Node_in and the node Node_out are output as an output signal Q while the power supply voltage is applied.

An inverted clock signal CB, a reset signal, and/or the like in addition to the data D and the clock signal C may be input to the memory circuit 110. Moreover, an input clock signal may be a plurality of clock signals having different phases.

The memory circuit 110 is a volatile register, a flip-flop, or a latch circuit. For example, when the memory circuit 110 is a register, a D register, a T register, a JK register, a SR register, or the like can be used.

While application of the power supply voltage is stopped, a potential held at the node Node_in is stored in the memory circuit 120. The potential stored in the memory circuit 120 is restored at the node Node_out in the memory circuit 110 when application of the power supply voltage is restarted. Note that the potentials held at the node Node_in and the node Node_out in the memory circuit 110 are lost when application of the power supply voltage to the memory circuit 110 is stopped.

Stopping application of the power supply voltage in the semiconductor device 10 is switching the potential of the power supply line VL from the high power supply potential VDD to the ground potential. Note that a switch may be provided between the power supply line VL and the memory circuit 110, in which case application of the power supply voltage can be stopped by turning off the switch.

Restarting application of the power supply voltage in the semiconductor device 10 is switching the potential of the power supply line VL from the ground potential to the high power supply potential VDD. A switch may be provided between the power supply line VL and the memory circuit 110, in which case application of the power supply voltage can be restarted by turning on the switch.

The memory circuit 120 includes a node Node_M capable of holding a potential corresponding to data "1" or data "0" as data even while application of the power supply voltage is stopped. Like the memory circuit 110, the memory circuit 120 is supplied with the power supply voltage based on the high power supply potential VDD supplied to the power supply line VL and the ground potential supplied to a ground line as the low power supply potential. Note that the memory circuit 120 may be referred to as a second memory circuit.

The memory circuit 120 in FIG. 1 includes a transistor 121 (also referred to as first transistor), a capacitor 122, a transistor 123 (also referred to as second transistor), a transistor 124 (also referred to as third transistor), a transistor 125 (also referred to as fourth transistor), a capacitor 126 (also referred to as first capacitor), a capacitor 127 (also referred to as second capacitor), and an inverter circuit 128.

In FIG. 1, for explanation, a node connected to one electrode of the capacitor 126 is shown as a node V_C1 and a node connected to one electrode of the capacitor 127 is shown as a node V_C2.

A gate of the transistor 121 is supplied with a control signal WE (also referred to as write control signal). One of a source and a drain of the transistor 121 is supplied with data held at the node Node_in. The data is transferred through the transistor 121 and is held at the node Node_M connected to the other of the source and the drain of the transistor 121. As an example, the transistor 121 is an n-channel transistor in the following description.

The potential of the node Node_M is held at one electrode of the capacitor 122. The other electrode of the capacitor 122 is supplied with a fixed potential, here, the ground potential of a ground line. Note that the capacitor 122 can be eliminated when the transistor 123 has large gate capacitance, for example.

A gate of the transistor 123 is supplied with a potential of the node Node_M. One of a source and a drain of the transistor 123 is supplied with a potential of the node V_C2, and the other thereof is supplied with the ground potential. As an example, the transistor 123 is an n-channel transistor in the following description.

A gate of the transistor 124 is supplied with a control signal RE_b (also referred to as inverted read control signal). One of a source and a drain of the transistor 124 is supplied with a potential of the power supply line VL. The potential of the power supply line VL is transferred through the transistor 124 and is held at the node V_C1 connected to the other of the source and the drain of the transistor 124. As an example, the transistor 124 is an n-channel transistor in the following description.

The potential of the node V_C1 is held at one electrode of the capacitor 126. The other electrode of the capacitor 126 is supplied with a fixed potential, here, the ground potential of a ground line.

A gate of the transistor 125 is supplied with a control signal RE (also referred to as read control signal). One of a source and a drain of the transistor 125 is supplied with a potential of the node V_C1. The potential of the node V_C1 is transferred through the transistor 125 and is held at the node V_C2 connected to the other of the source and the drain of the transistor 125. As an example, the transistor 125 is an n-channel transistor in the following description.

The potential of the node V_C2 is held at one electrode of the capacitor 127. The other electrode of the capacitor 127 is supplied with a fixed potential, here, the ground potential of a ground line.

An input terminal of the inverter circuit 128 is supplied with a potential of the node V_C2. The inverter circuit 128 supplies a potential of its output terminal to the node Node_out in the memory circuit 110. The potential of the output terminal of the inverter circuit 128 corresponds to a potential corresponding to data stored in the memory circuit 120, that is, a potential of the node Node_M.

The control signal WE is a signal for switching between continuity and discontinuity between the node Node_in and the node Node_M. With the control signal WE, the transistor 121 can function as a switch capable of being turned on and off. When the transistor 121 is an n-channel transistor, the transistor 121 is turned on when the control signal WE is at H level and is turned off when the control signal WE is at L level.

With the structure illustrated in FIG. 1, a potential corresponding to data is held at the node Node_M, and the semiconductor device 10 stores the data. By turning off the transistor 121, the node Node_M holds the potential for a long time so that data is stored.

To prevent a potential change associated with charge transfer at the node Node_M and retain data for a long time, the following two features are required: one is extremely low leakage current between the source and the drain of the transistor 121, and the other is extremely low leakage current through a gate insulating film of the transistor 123.

In view of the above, a transistor with extremely low leakage current between its source and drain is used as the transistor 121. Here, low leakage current means that a normalized leakage current per micrometer in channel width at room temperature is 10 zA/μm or lower. Since leakage current is preferably as low as possible, the normalized leakage current is preferably 1 zA/μm or lower, more preferably 10 yA/μm or lower, still more preferably 1 yA/μm or lower. Note that a voltage between the source and the drain in this case is approximately 0.1 V, 5 V, or 10 V, for example. An example of a transistor with extremely low leakage current between its source and drain is a transistor in which a channel is formed in an oxide semiconductor.

As the transistor 123, a transistor with extremely low leakage current through a gate insulating film is used. The leakage current through a gate insulating film of the transistor 123 is preferably as low as the leakage current between the source and the drain of the transistor 121. In a Si transistor included in the semiconductor device 10, a gate insulating film is reduced in thickness with reduction in the transistor size; thus, a leakage current through the gate insulating film becomes higher. On the other hand, the size of an OS transistor is not necessarily made smaller than that of a Si transistor; therefore, a gate insulating film of the OS transistor can be made thick to reduce leakage current through the gate insulating film.

The leakage current of the transistor 123 through the gate insulating film is preferably 10 yA or lower, more preferably 1 yA or lower. When the leakage current is 10 yA or lower and the capacitance of the node Node_M and the allowable voltage fluctuation are assumed to be 10 fF and 0.3 V, respectively, the node Node_M can hold charge for about 10 years ($t \approx 3 \times 10^8$ s).

When the transistors 121 and 123 are each a transistor with a channel width and length of 1 μm and 1 μm, to achieve a leakage current of 10 yA or lower to enable the above charge retention, the equivalent oxide thickness of the gate insulating film is approximately 6 nm or more. To achieve the above low leakage current, the thickness of the gate insulating film of the OS transistor is made different from that of a gate insulating film of a Si transistor provided in another layer. Specifically, the gate insulating film of the transistors 121 and 123 is made thicker than that of the transistors 124 and 125 that are Si transistors. This is preferable because a reduction in the thickness of the gate insulating film of the Si transistor does not adversely affect charge retention at the node Node_M.

The control signal RE_b is a signal for switching between continuity and discontinuity between the power supply line VL and the node V_C1. With the control signal RE_b, the transistor 124 can function as a switch capable of being turned on and off. When the transistor 124 is an n-channel transistor, the transistor 124 is turned on when the control signal RE_b is at H level and is turned off when the control signal RE_b is at L level. The control signal RE_b turns on the transistor 124 while a potential held at the node Node_M is not supplied to the node Node_out, that is, while data is not read from the memory circuit 120.

The control signal RE is a signal for switching between continuity and discontinuity between the node V_C1 and the node V_C2. With the control signal RE, the transistor 125 can function as a switch capable of being turned on and off. When the transistor 125 is an n-channel transistor, the transistor 125 is turned on when the control signal RE is at H level and is turned off when the control signal RE is at L level. The control signal RE turns on the transistor 125 while a potential held at the node Node_M is supplied to the node Node_out, that is, while data is read from the memory circuit 120.

Note that the control signal RE_b and the control signal RE are opposite in phase. In other words, these signals alternately turn on and off the corresponding transistors 124 and 125, thereby making only one of transistors 124 and 125 on.

H-level potentials of the control signal WE, the control signal RE, and the control signal RE_b are preferably higher than the high power supply potential VDD. Specifically, such an H-level potential is preferably higher than the high power supply potential VDD by the threshold voltage of a transistor whose gate is supplied with the signal, in which case potentials held at the nodes can be prevented from varying depending on the threshold voltages of the transistors.

The potential of the node Node_M is a potential corresponding data at the node Node_in. Specifically, the node Node_M holds an H-level potential when data at the node Node_in is data "1", whereas the node Node_M holds an L-level potential when data at the node Node_in is data "0". Thus, the transistor 123 is turned on when data "1" is stored in the memory circuit 120 and is turned off when data "0" is stored in the memory circuit 120.

The potentials of the node V_C1 and the node V_C2 are switched in response to the control signal RE and the control signal RE_b. When the transistor 124 is turned on and the transistor 125 is turned off, the capacitor 126 is charged by the power supply line VL, and the potential of the power supply line VL, that is, an H-level potential corresponding to the high power supply potential VDD is held at the node V_C1. Meanwhile, when the transistor 124 is turned off and the transistor 125 is turned on, charge stored in the capacitor 126 in advance is distributed to the capacitor 127. In this charge distribution, changes in the potentials of the node V_C1 and the node V_C2 vary depending on the potential of the node Node_M.

Specifically, when the potential of the node Node_M is an H-level potential, the transistor 123 is turned on, and the potential of the node V_C1 becomes the ground potential. When the transistor 125 is turned on while the transistor 123 is on, charge held at the node V_C1 and the node V_C2 is released.

When the potential of the node Node_M is an L-level potential, the transistor 123 is turned off, and the potential of the node V_C1 becomes a potential obtained by charge distribution among the capacitors 126 and 127. When the transistor 125 is turned on while the transistor 123 is off, the node V_C1 and the node V_C2 are brought into an electrically floating state. The potentials of the node V_C1 and the node V_C2 become equal to each other because charge stored at the nodes is distributed to the capacitors 126 and 127.

To make the potential of the node V_C2 closer to an H-level potential by charge distribution among the node V_C1 and the node V_C2, the capacitance of the capacitor 126 is set larger than that of the capacitor 127. This decreases the amount of reduction in the potential of the node V_C2 from the H-level potential, which is the potential of the node V_C1, when continuity is established between the node V_C1 and the node V_C2.

When the node Node_M has an L-level potential, the potential of the node V_C2 is controlled to be close to an H-level potential, so that the potential of a signal output through the inverter circuit 128 becomes a potential obtained by reversing the potential of the node V_C2, namely the L-level potential, which is the potential of the node Node_M. Meanwhile, when the node Node_M has an H-level potential, the potential of the node V_C2 becomes the ground potential, that is, the L-level potential, and the potential of a signal output through the inverter circuit 128 becomes a potential obtained by reversing the potential of the node V_C2, namely the H-level potential, which is the potential of the node Node_M. Accordingly, the inverter circuit 128 can output data to the node Node_out in response to a change in the potential of the node V_C2, specifically outputs data "1" when the node V_C2 has an H-level potential and outputs data "0" when the node V_C2 has an L-level potential. The output data corresponds to the aforementioned data at the node Node_in.

In the structure of FIG. 1, whether data stored in the memory circuit 120 is restored to the memory circuit 110 is determined depending on whether charge stored in the capacitor 126 in advance is distributed to the capacitor 127. This restoration operation can be performed only by switching the control signal RE and the control signal RE_b.

As described above, in the structure of this embodiment illustrated in FIG. 1, an OS transistor including a gate insulating film that is thicker than that in a Si transistor is provided as the transistor 123 whose gate is connected to the node Node_M for retaining charge. In addition, charge is stored in the capacitor 126, and data at the node for retaining charge is read based on whether the stored charge is distributed to the capacitor 127. In the above structure, since a Si transistor, in which leakage current through a gate insulating film occurs, is not used as a transistor connected to the node for retaining charge, charge retention characteristics of the node can be improved.

In the structure of this embodiment illustrated in FIG. 1, charging of the capacitor 126, which is necessary for data reading, can be automatically performed by supply of the high power supply potential to the power supply line VL. For this reason, a signal for controlling charging of the capacitor 126 is not required. Consequently, the sequence of restoring data in the memory circuit 120 to the memory circuit 110 can be controlled only by the control signal RE and the control signal RE_b; thus, data can be restored at high speed. Moreover, the restoration sequence can be performed any time until the next data is supplied to the node Node_M.

Figure 16:
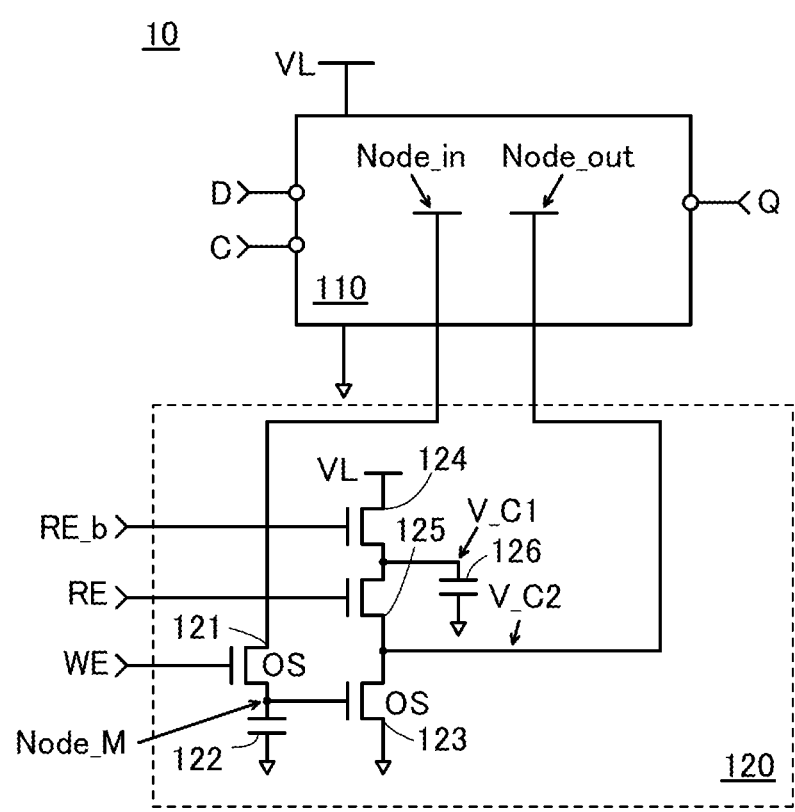
FIG. 16 is a circuit diagram of one embodiment of the present invention.

In the structure of the semiconductor device 10 in FIG. 1, the capacitor 127 and the inverter circuit 128 can be omitted. FIG. 16 is a diagram of the semiconductor device 10 without the capacitor 127 and the inverter circuit 128.

Figure 17:
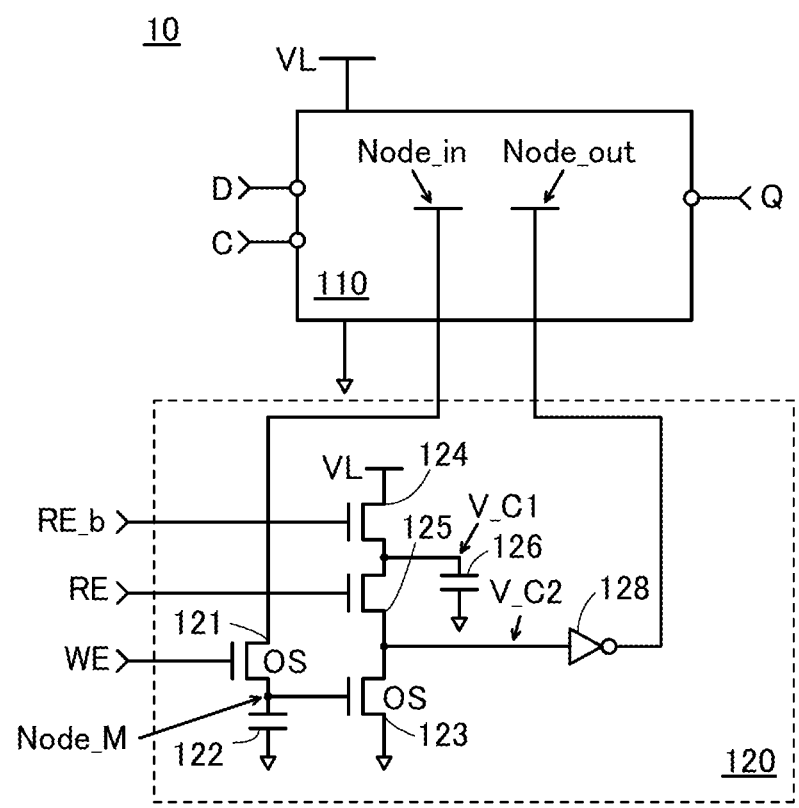
FIG. 17 is a circuit diagram of one embodiment of the present invention.

In the structure of the semiconductor device 10 in FIG. 1, the capacitor 127 can be omitted. FIG. 17 is a diagram of the semiconductor device 10 without the capacitor 127. By using parasitic capacitance of a wiring or gate capacitance of a transistor, the semiconductor device in FIG. 17 can operate in a manner similar to that of FIG. 1.

Figure 18:
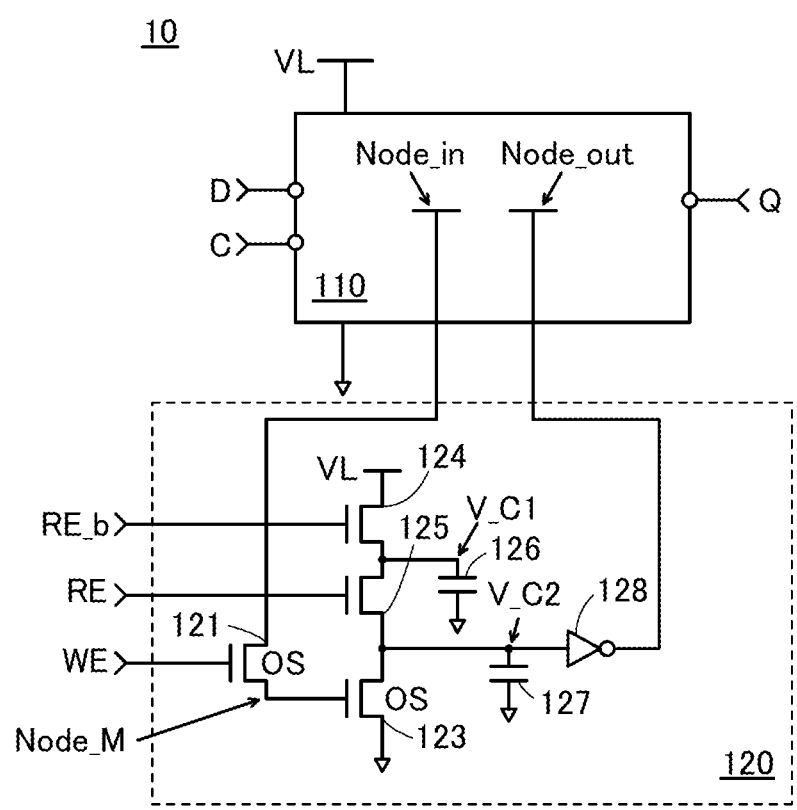
FIG. 18 is a circuit diagram of one embodiment of the present invention.

In the structure of the semiconductor device 10 in FIG. 1, the capacitor 122 can be omitted. FIG. 18 is a diagram of the semiconductor device 10 without the capacitor 122. By using parasitic capacitance of a wiring or gate capacitance of a transistor, the semiconductor device in FIG. 18 can operate in a manner similar to that of FIG. 1.

Figure 19:
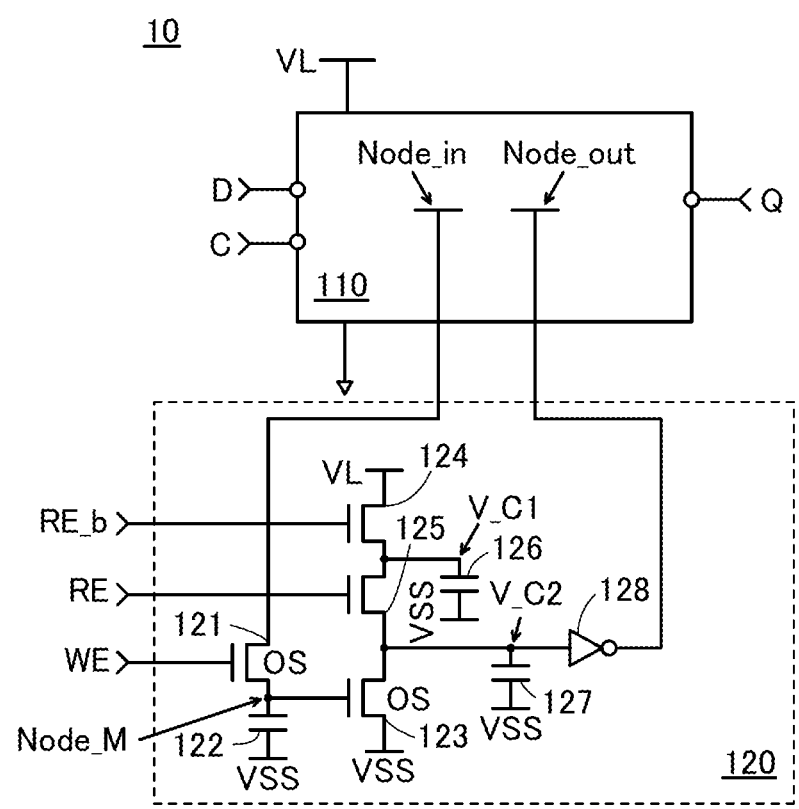
FIG. 19 is a circuit diagram of one embodiment of the present invention.
Figure 22:
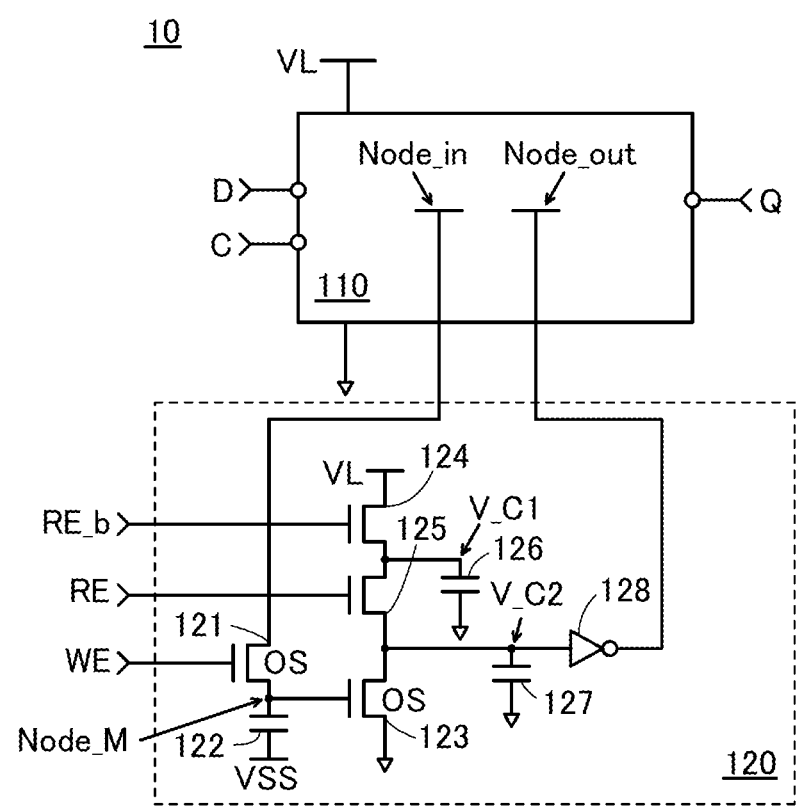
FIG. 22 is a circuit diagram of one embodiment of the present invention.
Figure 23:
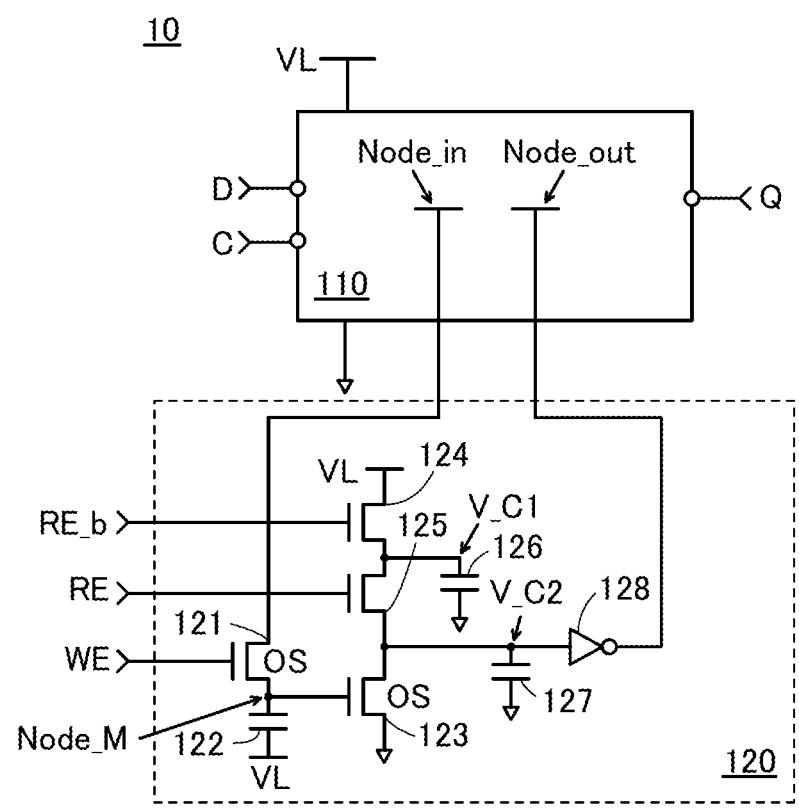
FIG. 23 is a circuit diagram of one embodiment of the present invention.
Figure 24:
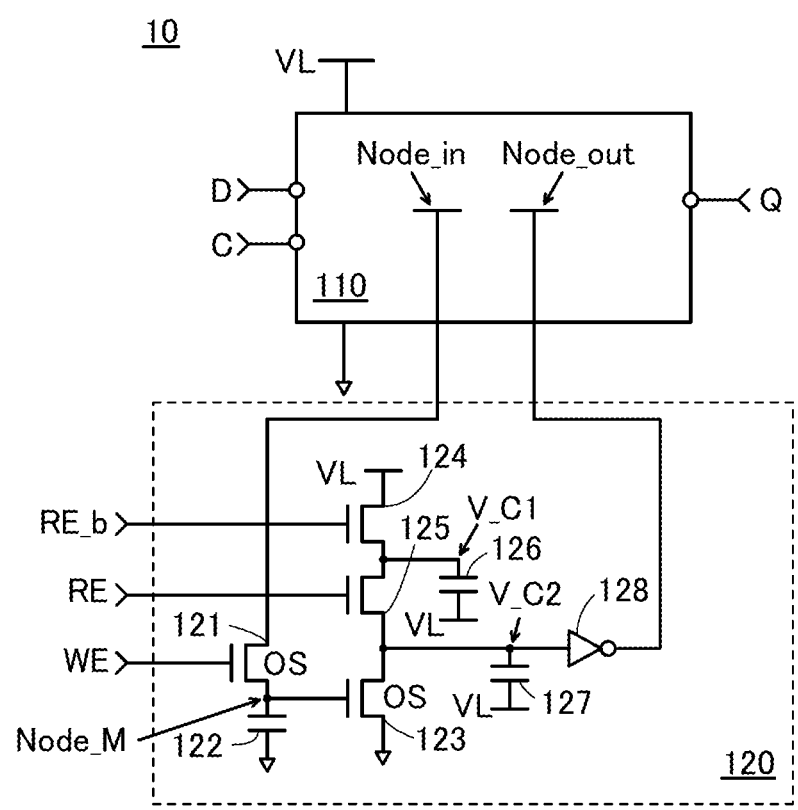
FIG. 24 is a circuit diagram of one embodiment of the present invention.

In the structure of the semiconductor device 10 in FIG. 1, the other electrode of each of the capacitors 122, 126, and 127 can be connected to a variety of wirings. For example, a fixed potential supplied to at least one of these electrodes may be a low power supply potential VSS. FIG. 19 illustrates an example of a diagram in which a wiring for applying the low power supply potential is connected to the capacitors and the other of the source and the drain of the transistor 123. As another example, it is possible that a fixed potential supplied to the other electrode of the capacitor 122 is the low power supply potential VSS and a fixed potential supplied to the other electrode of each of the capacitors 126 and 127 is the ground potential. FIG. 22 illustrates an example of a diagram showing this structure. As another example, it is possible that a fixed potential supplied to the other electrode of the capacitor 122 is the potential of the power supply line VL and a fixed potential supplied to the other electrode of each of the capacitors 126 and 127 is the ground potential. FIG. 23 illustrates an example of a diagram showing this structure. As another example, it is possible that a fixed potential supplied to the other electrode of each of the capacitors 126 and 127 is the potential of the power supply line VL and a fixed potential supplied to the other electrode of the capacitor 122 is the ground potential. FIG. 24 illustrates an example of a diagram showing this structure.

Figure 20:
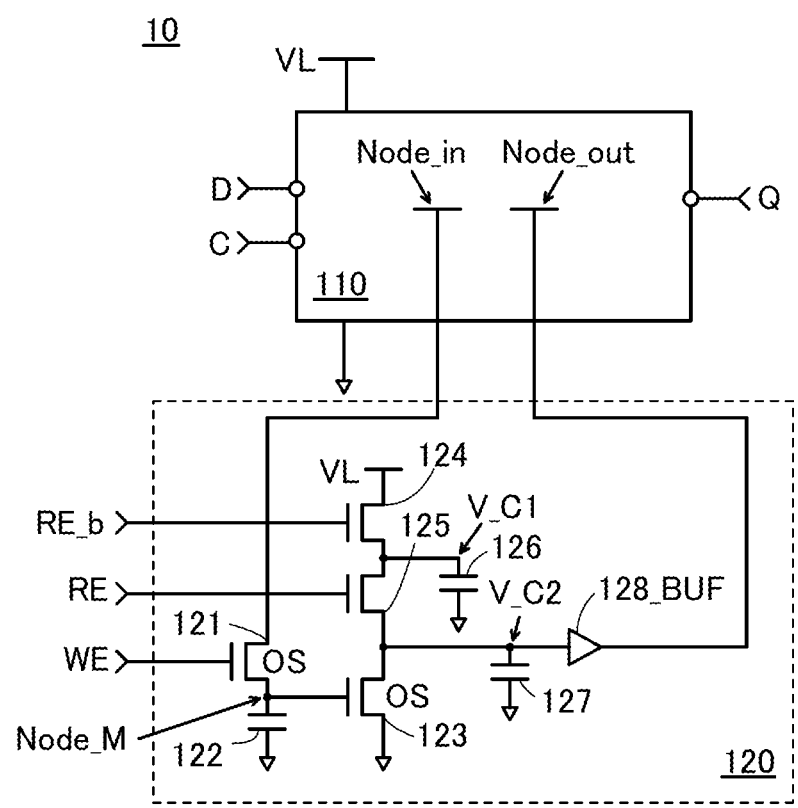
FIG. 20 is a circuit diagram of one embodiment of the present invention.

In the structure of the semiconductor device 10 in FIG. 1, the inverter circuit 128 can be replaced with an amplifier circuit or the like. For example, the inverter circuit 128 can be replaced with a buffer 128_BUF as illustrated in FIG. 20.

Figure 21:
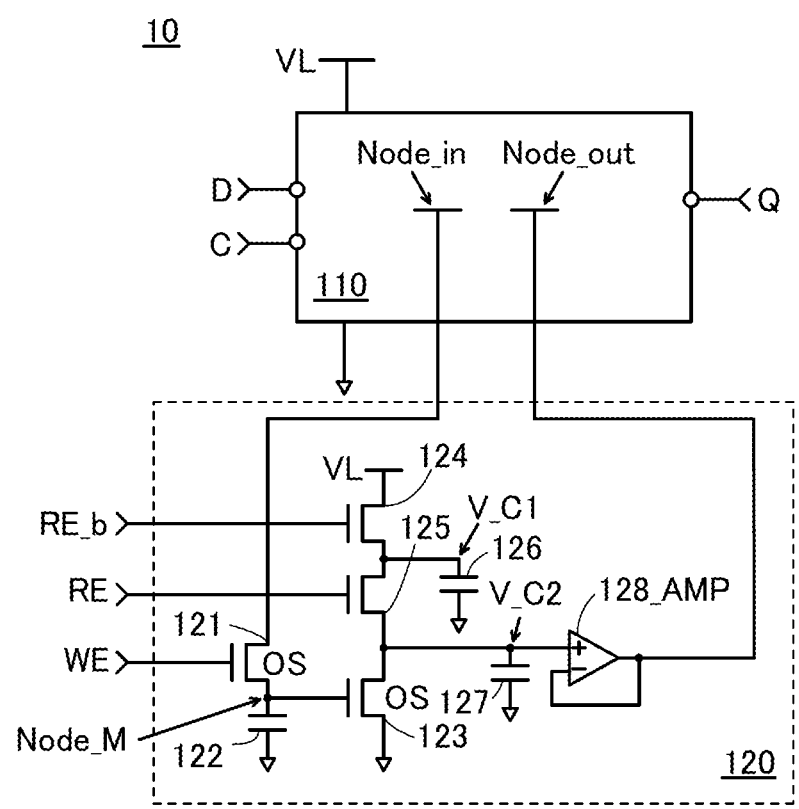
FIG. 21 is a circuit diagram of one embodiment of the present invention.

Moreover, in the structure of the semiconductor device 10 in FIG. 1, the inverter circuit 128 can be replaced with a circuit using an operational amplifier, a voltage follower circuit, or the like. For example, the inverter circuit 128 can be replaced with an amplifier 128_AMP as illustrated in FIG. 21.

Next, an example of the operation of the semiconductor device 10 will be described with reference to FIGS. 2 to 4.

Figure 2:
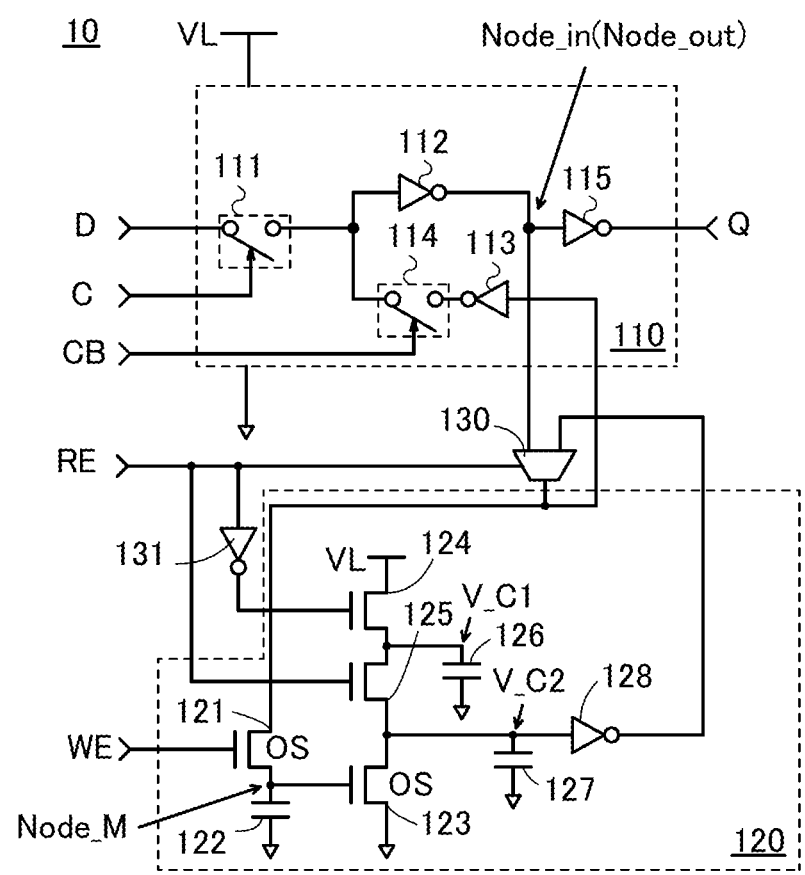
FIG. 2 is a circuit diagram of one embodiment of the present invention.

FIG. 2 is a circuit diagram of the semiconductor device 10 in which the configuration of the memory circuit 110 in FIG. 1 is specifically shown to explain an example of specific operation.

The memory circuit 110 includes the node Node_in and the node Node_out that are capable of holding a potential corresponding to data "1" or data "0" as data while the power supply voltage is applied. Note that in the example of the circuit diagram in FIG. 2, the node Node_in and the node Node_out are the same node.

As an example, FIG. 2 illustrates that the memory circuit 110 includes a switch 111, an inverter circuit 112, an inverter circuit 113, a switch 114, and an inverter circuit 115.

As an example, FIG. 2 illustrates that the data D, the clock signal C, and the inverted clock signal CB are input to the memory circuit 110 and the memory circuit 110 outputs the output signal Q. The memory circuit 110 is supplied with the power supply voltage based on potentials supplied to the power supply line VL and a ground line.

One terminal of the switch 111 is supplied with the data D. The on/off state of the switch 111 is controlled by the clock signal C so that the data D is captured in the memory circuit 110. The captured data is held by an inverter loop consisting of the inverter circuits 112 and 113. The on/off state of the switch 114 is controlled by the inverted clock signal CB so that data is held. Then, a signal obtained by inverting the data D held at the node Node_in is inverted again by the inverter circuit 115, whereby the output signal Q corresponding to the data D can be output.

In the structure of FIG. 2, data is stored in the memory circuit 120 and restored to the memory circuit 110 through a selector 130. Depending on the control signal RE, the selector 130 controls whether to return a signal at the node Node_in to the inverter loop or return a signal output from the memory circuit 120 to the node Node_in. In a period during which data is held in the memory circuit 110, the selector 130 is supplied with an L-level control signal RE and is thus switched so that a signal at the node Node_in is returned to the inverter loop. In a period during which data stored in the memory circuit 120 is restored to the memory circuit 110, the selector 130 is supplied with an H-level control signal RE and is thus switched so that a signal output from the memory circuit 120 is returned to the node Node_in.

An inverter circuit 131 is a circuit that generates a control signal corresponding to the control signal RE_b shown in FIG. 1. An input terminal of the inverter circuit 131 is supplied with the control signal RE. A signal output from an output terminal of the inverter circuit 131 is supplied to the gate of the transistor 124.

Figure 3:
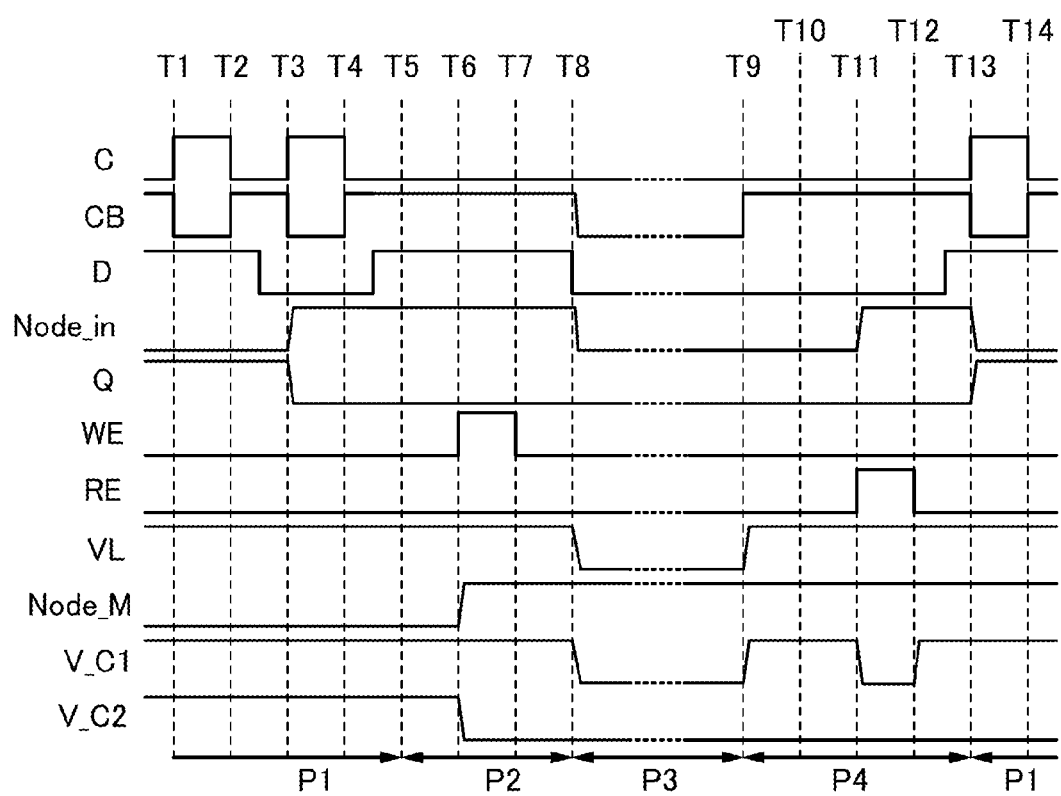
FIG. 3 is a timing chart of one embodiment of the present invention.

FIG. 3 is a timing chart of the semiconductor device 10 illustrated in FIG. 2. FIG. 3 shows the case where an H-level potential is stored at the node Node_M in the memory circuit 120 and then restored.

The timing chart in FIG. 3 shows changes in signals or potentials of the clock signal C, the inverted clock signal CB, the data D, the node Node_in, the output signal Q, the control signal WE, the control signal RE, the power supply line VL, the node Node_M, the node V_C1, and the node V_C2.

In the timing chart in FIG. 3, periods P1 to P4 show the state of the semiconductor device 10. The period P1 is a normal operation period. The period P2 is a transition period for operation stop. The period P3 is an operation stop period. The period P4 is a transition period for operation restart. Moreover, in the timing chart in FIG. 3, times T1 to T14 are used to explain the operation.

In the period P1 for normal operation, H-level signals and L-level signals are alternately supplied as the clock signal C and the inverted clock signal CB so that the clock signal C and the inverted clock signal CB are opposite in phase. The control signal RE and the control signal WE are at L level. The high power supply potential is supplied to the power supply line VL. At this time, the memory circuit 110 can operate as a normal register or flip-flop. Furthermore, in the period P1, the node V_C1 is charged with the high power supply potential of the power supply line VL to have an H-level potential, and the node V_C2 is floating.

In the period P2, which is a transition period for operation stop, fixed potentials are supplied as the clock signal C and the inverted clock signal CB. In other words, the clock signal C is fixed at L level and the inverted clock signal CB is fixed at H level. In a period between the time T6 and the time T7, the control signal WE is set at H level and data "1" held at the node Node_in in the memory circuit 110, here an H-level potential, is stored at the node Node_M.

In the period P3 for operation stop, the power supply line VL is set at the ground potential, that is, an L-level potential. That is, application of the power supply voltage to the semiconductor device 10 is stopped. At this time, the control signal RE and the control signal WE are at L level. The data D, the clock signal C, and the inverted clock signal CB are at L level. Note that it is possible that the power supply line VL is fixed at the high power supply potential VDD and the potential of the ground line is switched from the ground potential to the high power supply potential VDD to stop application of the power supply voltage.

In the period P3, which is an operation stop period, power consumption of the semiconductor device 10 can be extremely small because application of the power supply voltage is stopped. Note that the potential of the node Node_M is kept constant because leakage current of the transistor 121 and the transistor 123 hardly flows.

In the period P4, which is the transition period for operation restart, the potentials of the wirings are sequentially brought back to the states at the end of the preceding normal operation period, that is, at the time T5. First, at the time T9, the power supply line VL is set at H level to have the high power supply potential. Thus, the node V_C1 is charged. Note that the node Node_in is floating until data is fixed. At the time when the node V_C1 reaches H level by charging (at the time T11 in FIG. 3), the control signal RE is set at H level. Thus, the potentials of the node V_C1 and the node V_C2 change in accordance with the potential of the node Node_M. According to FIG. 3, the transistor 123 is turned on, so that the potentials of the node V_C1 and the node V_C2 become L level. When the potential of the node V_C2 becomes L level, an output signal of the inverter circuit 128 becomes H level. When the control signal RE is set at H level, the selector 130 supplies an output signal of the inverter circuit 128 to the node Node_in; consequently, the potential of the node Node_in in the memory circuit 110 is returned to the H-level potential, which is data at the time T5.

Then, when supply of the clock signal C and the inverted clock signal CB is started again from the time T13, normal operation following the operation at the time T5 can be resumed.

Figure 4:
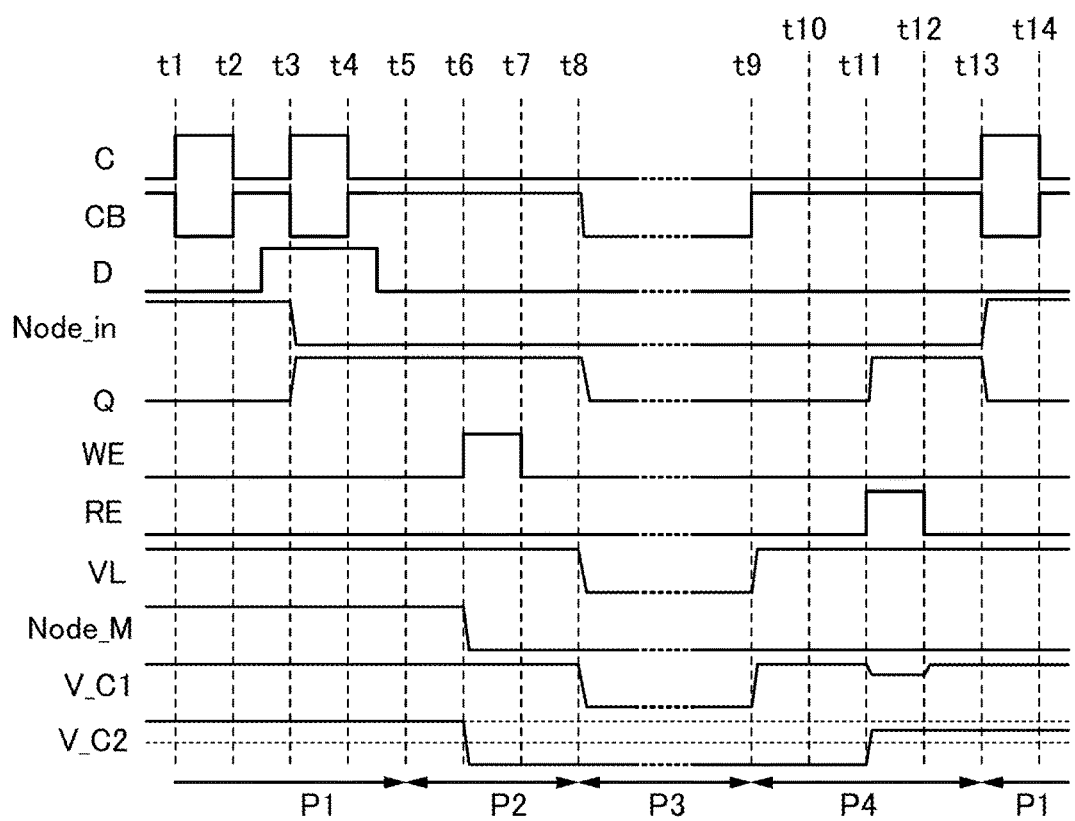
FIG. 4 is a timing chart of one embodiment of the present invention.

Next, FIG. 4 shows the case where an L-level potential is stored at the node Node_M in the memory circuit 120 and then restored.

As in FIG. 3, the timing chart in FIG. 4 shows changes in signals or potentials of the clock signal C, the inverted clock signal CB, the data D, the node Node_in, the output signal Q, the control signal WE, the control signal RE, the power supply line VL, the node Node_M, the node V_C1, and the node V_C2.

As in FIG. 3, the periods P1 to P4 in the timing chart of FIG. 4 show the state of the semiconductor device 10. The period P1 is a normal operation period. The period P2 is a transition period for operation stop. The period P3 is an operation stop period. The period P4 is a transition period for operation restart. Moreover, in the timing chart in FIG. 4, times t1 to t14 are used to explain the operation.

In the period P1 for normal operation, H-level signals and L-level signals are alternately supplied as the clock signal C and the inverted clock signal CB so that the clock signal C and the inverted clock signal CB are opposite in phase. The control signal RE and the control signal WE are at L level. The high power supply potential is supplied to the power supply line VL. At this time, the memory circuit 110 can operate as a normal register or flip-flop. Furthermore, in the period P1, the node V_C1 is charged with the high power supply potential of the power supply line VL to have an H-level potential, and the node V_C2 is floating.

In the period P2, which is a transition period for operation stop, fixed potentials are supplied as the clock signal C and the inverted clock signal CB. In other words, the clock signal C is fixed at L level and the inverted clock signal CB is fixed at H level. In a period between the time t6 and the time t7, the control signal WE is set at H level and data "0" held at the node Node_in in the memory circuit 110, here an L-level potential, is stored at the node Node_M.

In the period P3 for operation stop, the power supply line VL is set at the ground potential, that is, an L-level potential. That is, application of the power supply voltage to the semiconductor device 10 is stopped. At this time, the control signal RE and the control signal WE are at L level. The data D, the clock signal C, and the inverted clock signal CB are at L level.

In the period P3, which is an operation stop period, power consumption of the semiconductor device 10 can be extremely small because application of the power supply voltage is stopped. Note that the potential of the node Node_M is kept constant because leakage current of the transistor 121 and the transistor 123 hardly flows.

In the period P4, which is the transition period for operation restart, the potentials of the wirings are sequentially brought back to the states at the end of the preceding normal operation period, that is, at the time t5. First, at the time t9, the power supply line VL is set at H level to have the high power supply potential. Thus, the node V_C1 is charged. Note that the node Node_in is floating until data is fixed. At the time when the node V_C1 reaches H level by charging (at the time t11 in FIG. 4), the control signal RE is set at H level. Thus, the potentials of the node V_C1 and the node V_C2 change in accordance with the potential of the node Node_M. According to FIG. 4, the transistor 123 is turned off, so that charge stored at the node V_C1 is distributed to the node V_C2 through the transistor 125; thus, the potential of the node V_C1 decreases and the potential of the node V_C2 increases. Setting the capacitance of the capacitor 126 larger than that of the capacitor 127 increases the potential of the node V_C2 to a value close to the H-level potential. The increase in the potential of the node V_C2 results in an L-level output signal of the inverter circuit 128. When the control signal RE is set at H level, the selector 130 supplies an output signal of the inverter circuit 128 to the node Node_in; consequently, the potential of the node Node_in in the memory circuit 110 is returned to the L-level potential, which is data at the time t5.

Then, when supply of the clock signal C and the inverted clock signal CB is started again from the time t13, normal operation following the operation at the time t5 can be resumed.

In the operation of the semiconductor device described so far in this embodiment, application of the power supply voltage can be stopped as appropriate with data storage and restoration in the memory circuits 110 and 120. Thus, power consumption can be reduced.

In the semiconductor device described in this embodiment, data storage in the memory circuits 110 and 120 can be controlled by the conduction state of the transistor 121; thus, operation delay is less than that in a structure where data is stored in an external memory circuit such as flash memory. Furthermore, the semiconductor device can be configured so that data is stored in the memory circuit 120 before application of the power supply voltage is stopped and data is held in the memory circuit 110 in the other periods, during which the power supply voltage is applied. Consequently, the operation of storing data can be performed at high speed while the power supply voltage is applied, and operation delay can be suppressed. In the semiconductor device of this embodiment, the OS transistors and the Si transistors can be stacked; thus, the increase in the circuit area due to the increase in the number of elements can be prevented. The semiconductor device therefore has high area efficiency.

As described above, data can be saved from the memory circuit 110 to the memory circuit 120 and restored from the memory circuit 120 to the memory circuit 110 as in the timing charts of FIGS. 3 and 4.

Figure 5:
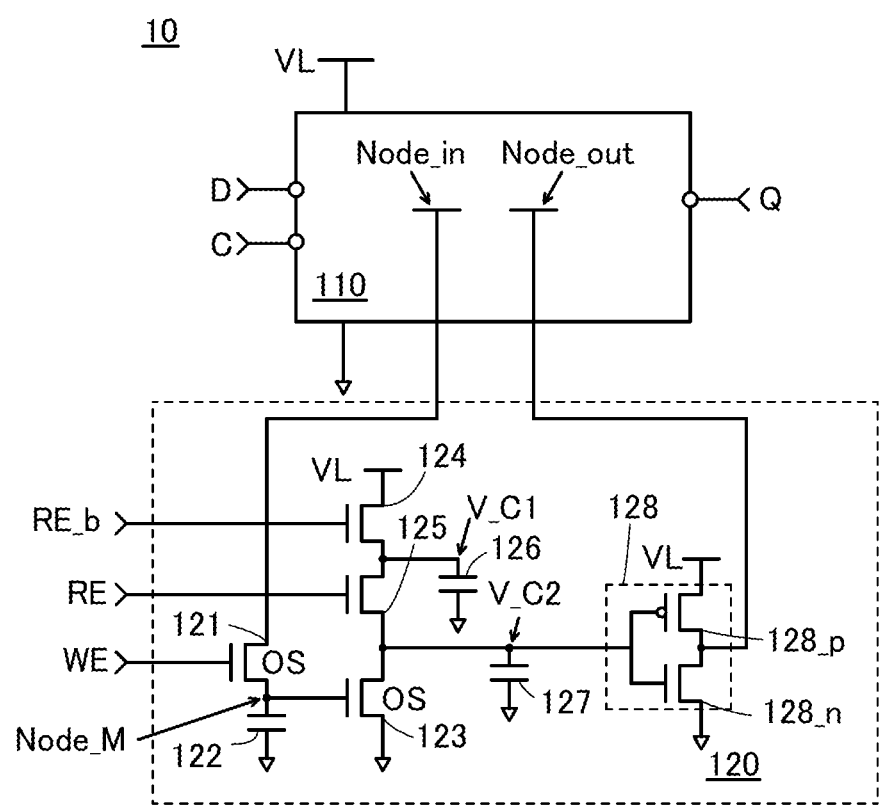
FIG. 5 is a circuit diagram of one embodiment of the present invention.

Note that the inverter circuit 128 shown in FIGS. 1 and 2 is preferably a CMOS inverter. FIG. 5 shows a specific circuit diagram.

The inverter circuit 128 illustrated in FIG. 5 includes a p-channel transistor 128_p supplied with the high power supply potential from the power supply line VL and an n-channel transistor 128_n supplied with the ground potential.

When the inverter circuit 128 is a CMOS circuit and the node V_C2 is connected to gates of the transistors 128_p and 128_n as illustrated in FIG. 5, by turning on one of these transistors depending on the amount of charge stored at the node V_C2, a signal having a potential obtained by reversing the potential of the node V_C2 can be output without reducing the amount of stored charge.

One embodiment of the present invention described above is a semiconductor device with improved charge retention characteristics of a node for retaining charge.

This embodiment can be combined with any of the other embodiments as appropriate.

Embodiment 2

In this embodiment, variation examples of the semiconductor device 10 in Embodiment 1 will be described. Here, Variations examples 1 to 7 will be described with reference to FIGS. 6 to 12.

Variation Example 1

Figure 6:
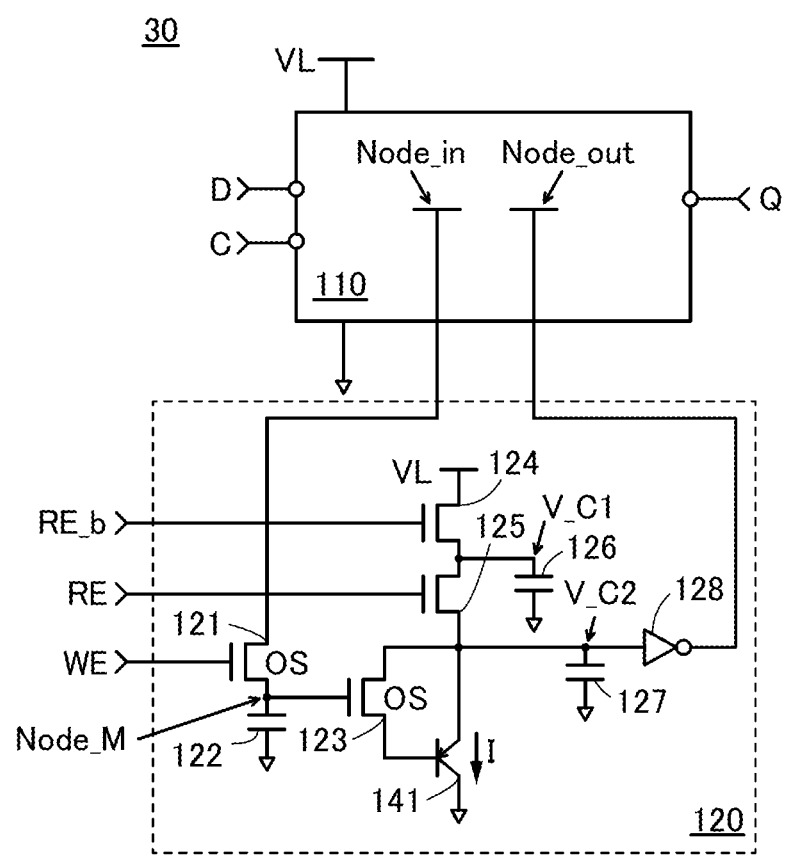
FIG. 6 is a circuit diagram of one embodiment of the present invention.

FIG. 6 is a circuit diagram illustrating a configuration example of a semiconductor device 30 different from the semiconductor device 10 of FIG. 1 in that a bipolar transistor 141 (also referred to as fifth transistor) is connected to the source and the drain of the transistor 123.

The amount of current flowing through the transistor 123, which is the OS transistor, is smaller than that flowing through a Si transistor. For this reason, by connecting a collector of the bipolar transistor 141 to one of the source and the drain of the transistor 123 and connecting a base of the bipolar transistor 141 to the gate of the transistor 123 to have a Darlington configuration, the amount of current for controlling the potential of the node V_C2 can be increased while taking advantage of low gate leakage current of the OS transistor. The flow of current through the bipolar transistor 141 in the Darlington configuration is controlled by the on/off state of the transistor 123.

The configuration illustrated in FIG. 6 can increase the amount of current flowing depending on the conduction state of the transistor 123, which is switched by the potential of the node Node_M. Thus, even if the transistor performance is degraded when the transistor 123 is not a Si transistor, the potential of the node V_C2 can be controlled at higher speed by using a combination of the transistor 123 and a transistor achieving higher performance than a Si transistor.

Variation Example 2

Figure 7:
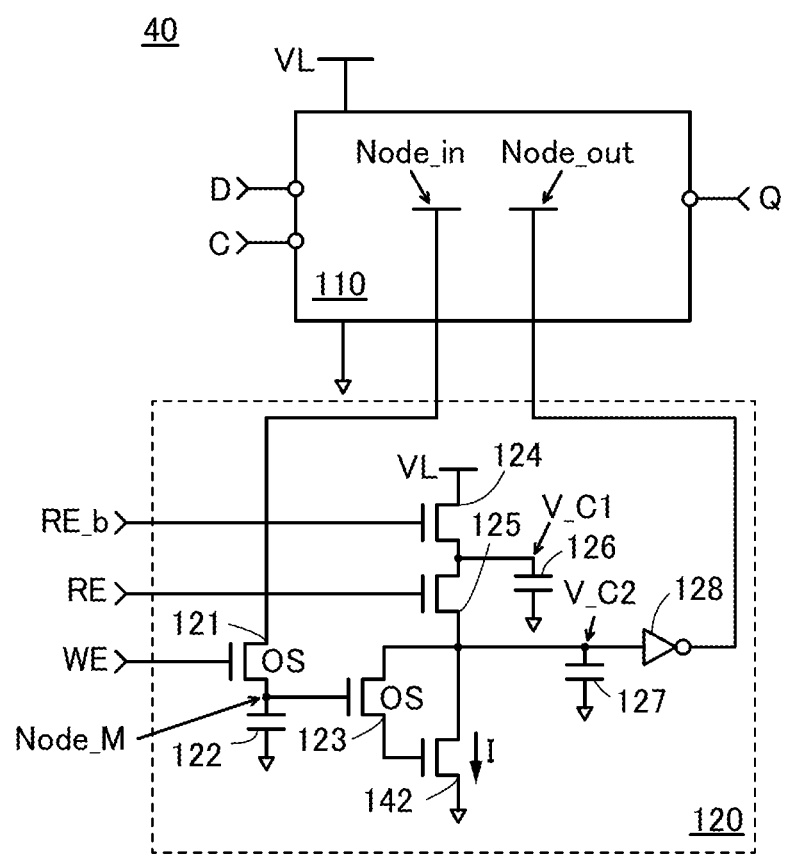
FIG. 7 is a circuit diagram of one embodiment of the present invention.

FIG. 7 is a circuit diagram illustrating a configuration example of a semiconductor device 40 different from the semiconductor device 10 of FIG. 1 in that a transistor 142 that is a Si transistor is connected to the source and the drain of the transistor 123.

The amount of current flowing through the transistor 123, which is the OS transistor, is smaller than that flowing through the Si transistor. For this reason, one of a source and a drain of the Si transistor 142 is connected to one of the source and the drain of the transistor 123 and a gate of the Si transistor 142 is connected to the other of the source and the drain of the transistor 123 to form a Darlington pair as in FIG. 6.

The configuration in FIG. 7 provides an effect similar to that obtained with the configuration in FIG. 6. In other words, the amount of current flowing depending on the conduction state of the transistor 123, which is switched by the potential of the node Node_M, can be increased. Thus, the potential of the node V_C2 can be controlled at higher speed.

Variation Example 3

Figure 8:
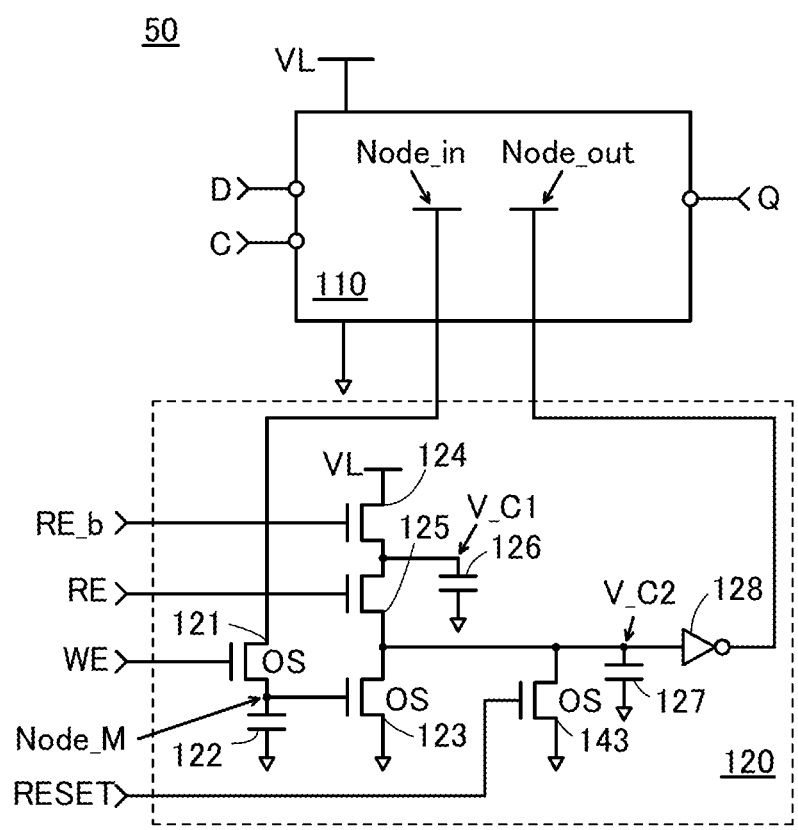
FIG. 8 is a circuit diagram of one embodiment of the present invention.

FIG. 8 is a circuit diagram illustrating a configuration example of a semiconductor device 50 different from the semiconductor device 10 of FIG. 1 in that a transistor 143 for initializing the potential of the node V_C2 is connected to the node V_C2. Although the transistor 143 is shown as an OS transistor, it may be a Si transistor. FIG. 8 illustrates an example where the potential of a ground line is supplied as a potential for initializing the node V_C2 connected to the transistor 143.

The transistor 143 can initialize the potential of the node V_C2 by being turned on in response to a reset signal RESET supplied to its gate. When the transistor 123 remains on, the node V_C2 is kept at a potential corresponding to charge distributed among the node V_C1 and the node V_C2. Providing the transistor for initialization as in the configuration of FIG. 8 enables initialization at an opportune time.

The potential of the node V_C2 is initialized after data saved from the memory circuit 110 is restored to the memory circuit 110. Since data held in the memory circuit 120 is not necessary after the data is restored to the memory circuit 110, initialization can be performed, for example, by setting the reset signal RESET at H level after data restoration.

Variation Example 4

Figure 9:
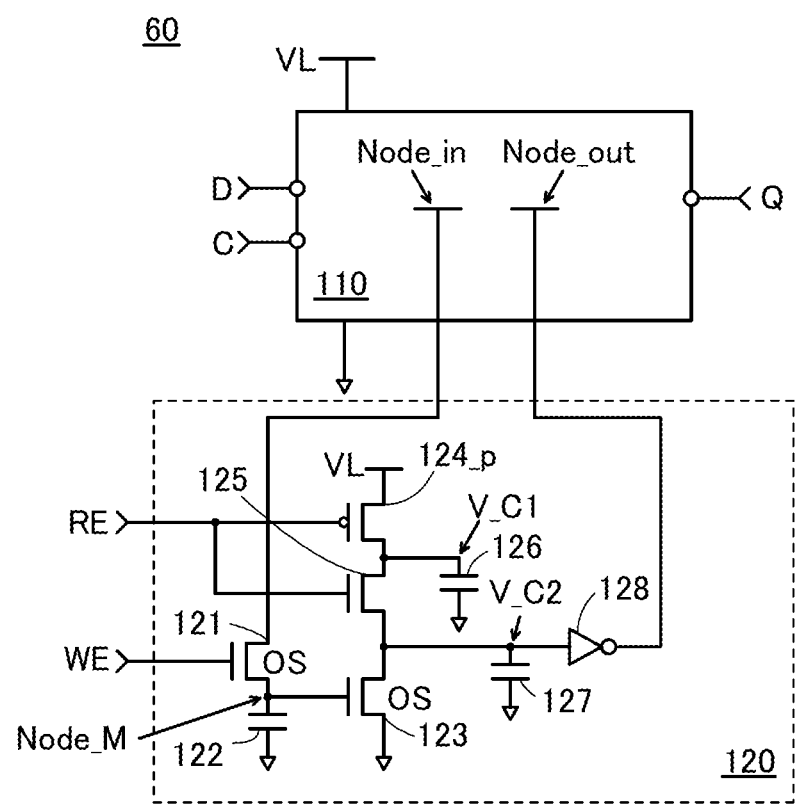
FIG. 9 is a circuit diagram of one embodiment of the present invention.

FIG. 9 is a circuit diagram illustrating a configuration example of a semiconductor device 60 in which the transistor 124 and the transistor 125 in the semiconductor device 10 of FIG. 1 are a p-channel transistor 124_p and an n-channel transistor, respectively.

Transistors of different conductivity types are used as the transistors 124 and 125 that are controlled to be alternately turned on and off, whereby one of the control signal RE and the control signal RE_b can be omitted and only the other thereof can be supplied to gates of the transistors 124 and 125. Thus, the number of kinds of signals input to the semiconductor device can be reduced.

Variation Example 5

Figure 10:
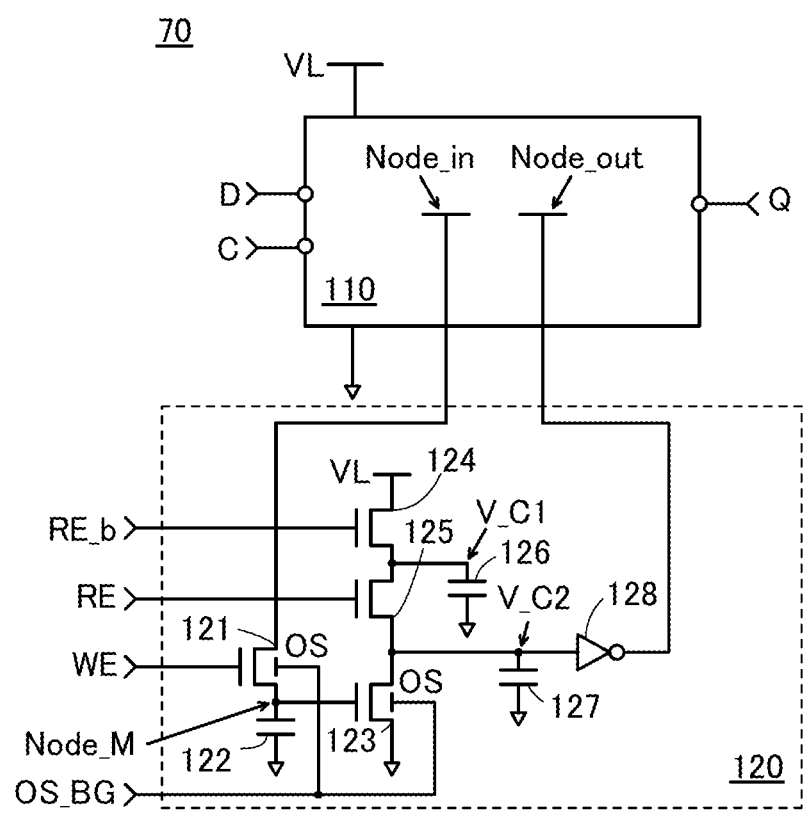
FIG. 10 is a circuit diagram of one embodiment of the present invention.

FIG. 10 is a circuit diagram illustrating a configuration example of a semiconductor device 70 different from the semiconductor device 10 of FIG. 1 in that a backgate signal OS_BG for controlling the threshold voltage is applied to backgates of the transistors 121 and 123.

Supply of the backgate signal OS_BG to the backgates of the transistors 121 and 123 can control the threshold voltages. If the threshold voltages of the transistors 121 and 123 fluctuate and the off-state leakage current increases as a result, charge might not be held at the node Node_M. For this reason, controlling the threshold voltages by supplying the backgate signal OS_BG in advance allows the node Node_M to hold charge reliably. Moreover, controlling the threshold voltage of the transistor reduces the voltage amplitude of a signal supplied to its gate, resulting in lower power consumption.

Variation Example 6

Figure 11:
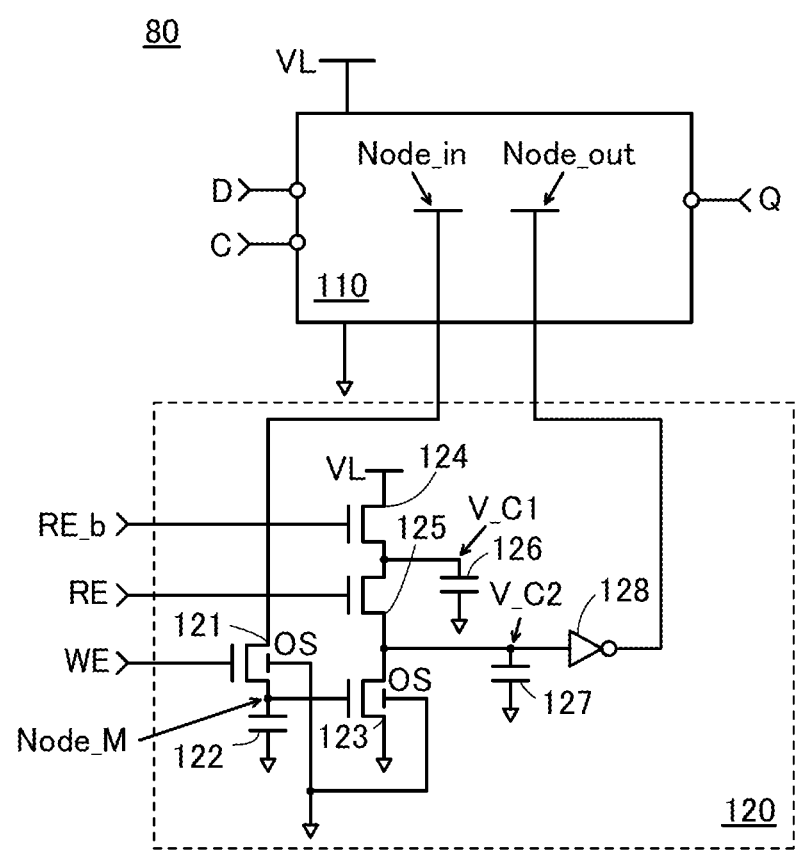
FIG. 11 is a circuit diagram of one embodiment of the present invention.

FIG. 11 is a circuit diagram illustrating a configuration example of a semiconductor device 80 different from the semiconductor device 10 of FIG. 1 in that a ground potential that is an L-level potential for shifting the threshold voltage in the positive direction is supplied to the backgates of the transistors 121 and 123.

With the configuration in FIG. 11, the threshold voltages of the transistors 121 and 123 can be shifted in the positive direction. Positive shift of the threshold voltage of the transistor reduces leakage current when an L-level potential of a signal supplied to its gate is the ground potential. In the configuration in FIG. 11, it is not necessary to supply the backgate signal OS_BG, so that the number of kinds of signals input to the semiconductor device can be reduced.

Variation Example 7

Figure 12:
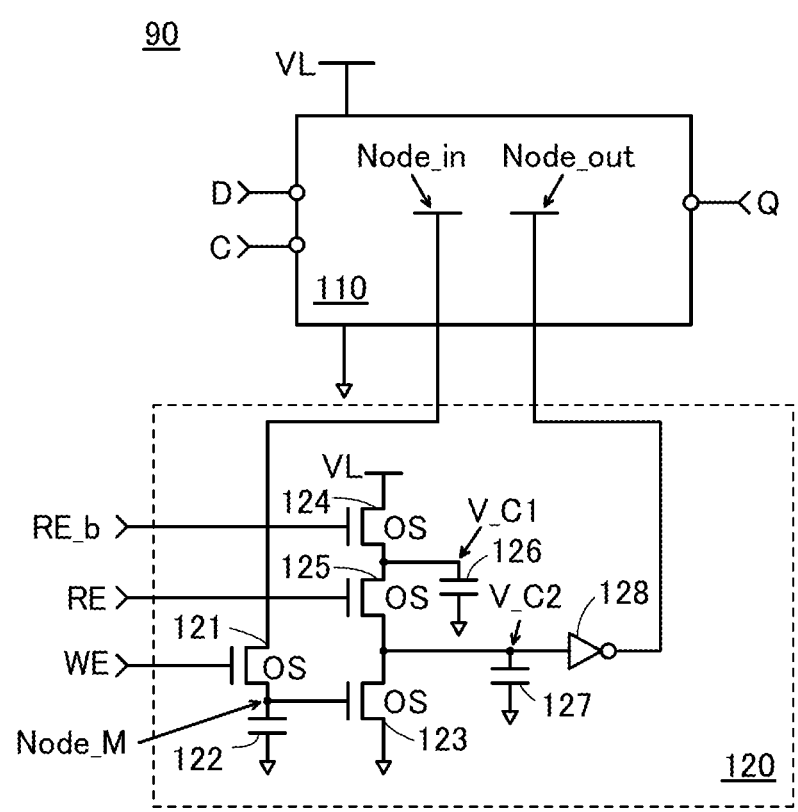
FIG. 12 is a circuit diagram of one embodiment of the present invention.

FIG. 12 is a circuit diagram illustrating a configuration example of a semiconductor device 90 different from the semiconductor device 10 of FIG. 1 in that the transistors 124 and 125 are OS transistors instead of Si transistors. Although not shown in FIG. 12, the transistor included in the inverter circuit 128 can also be an OS transistor.

Using OS transistors as all the transistors included in the memory circuit 120 eliminates steps and apparatuses for fabricating Si transistors. As a result, costs for fabricating the semiconductor device can be reduced.

Variation examples of the semiconductor devices described in this embodiment can be implemented in combination as appropriate, in which case it is possible to obtain the effects of the variation examples in addition to the effect of the semiconductor device described in Embodiment 1. Thus, a high-performance semiconductor device can be provided.

The structure described in this embodiment can be used as appropriate in combination with any of the structures described in the other embodiments.

Embodiment 3

This embodiment will explain an oxide semiconductor layer that can be used as a semiconductor layer including a channel formation region of the transistor with low off-state current described in the foregoing embodiments.

An oxide semiconductor used for the semiconductor layer including a channel formation region of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer including a channel formation region of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer including a channel formation region contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

The transistor including an i-type or substantially i-type oxide semiconductor film can have extremely favorable leakage current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

An oxide semiconductor film may include a non-single crystal, for example. The non-single crystal state is structured, for example, by at least one of c-axis aligned crystal (CAAC), polycrystal, microcrystal, and an amorphous part.

An oxide semiconductor may include CAAC, for example. Note that an oxide semiconductor including CAAC is referred to as a c-axis aligned crystalline oxide semiconductor (CAAC-OS).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image of the CAAC-OS obtained with a TEM, a boundary between the crystal parts or a grain boundary is not clearly observed in some cases. Since a clear grain boundary does not exist in the CAAC-OS, segregation of an impurity, high density of defect states, or a reduction in electron mobility is unlikely to occur, for example.

For example, the CAAC-OS sometimes includes a plurality of crystal parts whose c-axes are aligned in a direction parallel to a normal vector of a surface where the CAAC-OS is formed or a normal vector of a surface of the CAAC-OS. When the CAAC-OS is analyzed by an out-of-plane method with an X-ray diffraction (XRD) apparatus, a peak at 2θ of around 31° which shows alignment appears in some cases. Furthermore, for example, spots (luminescent spots) are observed in an electron diffraction pattern of the CAAC-OS in some cases. Note that an electron diffraction pattern obtained with an electron beam having a beam diameter of 10 nmϕ or smaller or 5 nmϕ or smaller is called a nanobeam electron diffraction pattern. In the CAAC-OS, for example, among crystal parts, the directions of the a-axis and the b-axis of one crystal part are sometimes different from those of another crystal part. In the CAAC-OS, for example, c-axes are aligned and a-axes and/or b-axes are not macroscopically aligned in some cases.

In each of the crystal parts included in the CAAC-OS, for example, the c-axis is aligned in a direction parallel to a normal vector of a surface where the CAAC-OS is formed or a normal vector of a surface of the CAAC-OS, metal atoms are arranged in a triangular or hexagonal pattern when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°, and the term "parallel" includes a range from −10° to 10°, preferably from −5° to 5°.

The CAAC-OS can be formed by reduction in the density of defect states, for example. In an oxide semiconductor, for example, oxygen vacancies are defect states. Oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small change in electrical characteristics and high reliability in some cases. A charge trapped by the trap states in the oxide semiconductor takes a long time to disappear. The trapped charge may behave like a fixed charge. Consequently, the transistor that contains the oxide semiconductor having a high density of trap states in the channel formation region has unstable electrical characteristics in some cases.

With the use of the highly purified intrinsic or substantially highly purified intrinsic CAAC-OS in a transistor, a change in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor ranges from 1 nm to 100 nm, or from 1 nm to 10 nm, for example. A microcrystal with a size ranging from 1 nm to 10 nm is specifically referred to as nanocrystal (nc). An oxide semiconductor including nanocrystal is referred to as a nanocrystalline oxide semiconductor (nc-OS). In an image of the nc-OS obtained with a TEM, for example, a boundary between crystal parts is not clearly observed in some cases. Since a clear grain boundary does not exist in an image of the nc-OS obtained with a TEM, for example, segregation of an impurity is unlikely to occur. In the nc-OS, since a clear grain boundary does not exist, high density of defect states or a reduction in electron mobility is unlikely to occur, for example.

In the nc-OS, for example, a microscopic region (e.g., a region ranging from 1 nm to 10 nm) has a periodic atomic order occasionally. Furthermore, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak that shows alignment does not appear in some cases. Moreover, for example, a halo pattern is shown in some cases in an electron diffraction pattern of the nc-OS obtained by using an electron beam having a beam diameter larger than the diameter of a crystal part (e.g., a beam diameter of 20 nmϕ or more, or 50 nmϕ or more). For example, spots are shown in some cases in a nanobeam electron diffraction pattern of the nc-OS obtained by using an electron beam having a beam diameter smaller than or equal to the diameter of a crystal part (e.g., a beam diameter of 10 nmϕ or less, or 5 nmϕ or less). In a nanobeam electron diffraction pattern of the nc-OS, for example, regions with high luminance in a circular pattern are shown in some cases. Moreover, in a nanobeam electron diffraction pattern of the nc-OS, for example, a plurality of spots are shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly arranged, the nc-OS has higher density of defect states than the CAAC-OS.

Note that an oxide semiconductor film may be a mixed film including two or more of a CAAC-OS, a polycrystalline oxide semiconductor, a microcrystalline oxide semiconductor, and an amorphous oxide semiconductor. The mixed film may include at least two of an amorphous oxide semiconductor region, a microcrystalline oxide semiconductor region, a polycrystalline oxide semiconductor region, and a CAAC-OS region, for example. Moreover, the mixed film may have a stacked structure of at least two of an amorphous oxide semiconductor region, a microcrystalline oxide semiconductor region, a polycrystalline oxide semiconductor region, and a CAAC-OS region.

This embodiment can be implemented in appropriate combination with any of the other embodiments.

Embodiment 4

Referring to a drawing, this embodiment will show a cross-sectional structure of transistors included in the semiconductor device of one embodiment of the disclosed invention.

Figure 13:
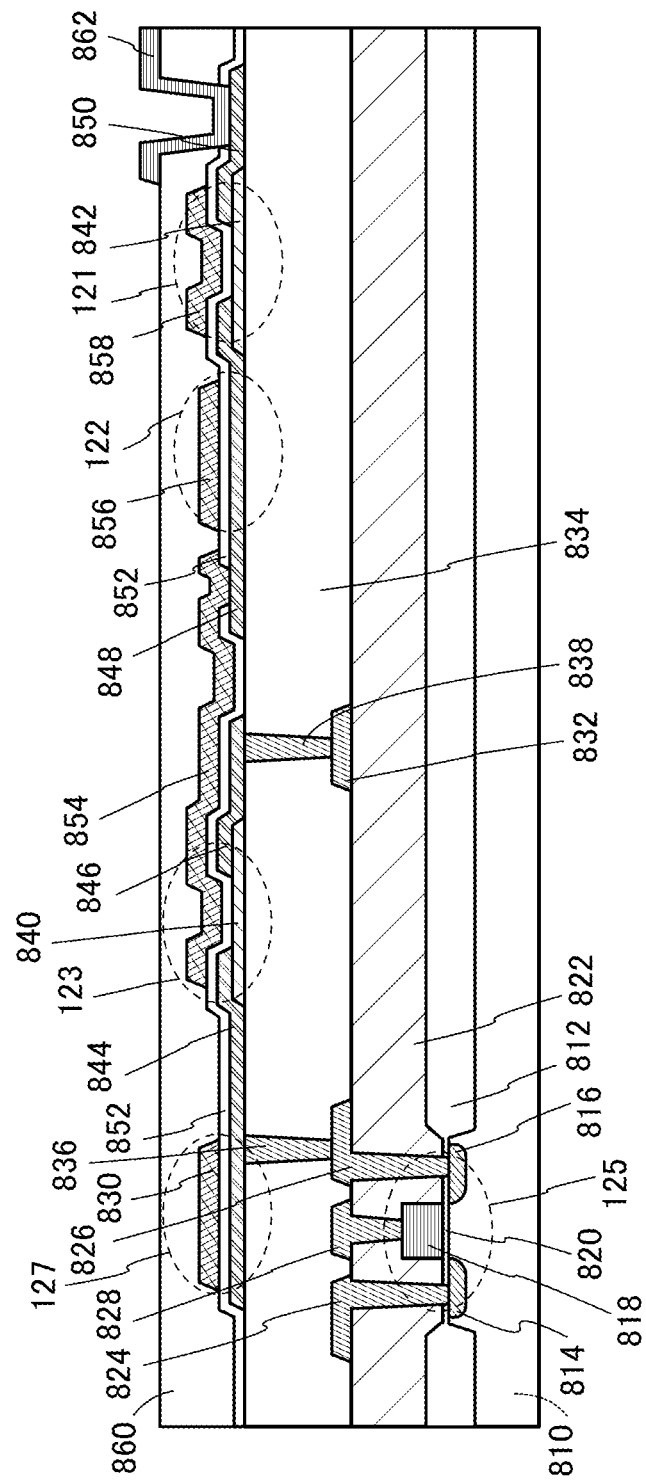
FIG. 13 is a cross-sectional view of one embodiment of the present invention.

FIG. 13 illustrates an example of part of a cross-sectional structure of the semiconductor device. FIG. 13 illustrates the transistor 121, the capacitor 122, the transistor 123, the transistor 125, and the capacitor 127 shown in Embodiment 1.

In the cross-sectional view in FIG. 13, the transistor 121, the capacitor 122, the transistor 123, the transistor 125 and the capacitor 127 shown in FIG. 1 are denoted by the same reference numerals.

The cross-sectional view in FIG. 13 shows an example where the transistor 125 is formed on a single crystal silicon substrate and the transistors 121 and 123 using an oxide semiconductor for a semiconductor layer including a channel formation region are formed over the transistor 125. In the transistor 125, a thin semiconductor layer of silicon, germanium, or the like in an amorphous, microcrystalline, polycrystalline, or single crystal state may be used for the semiconductor layer including a channel formation region.

In the cross-sectional view in FIG. 13, the transistors 121 and 123 are transistors in which an oxide semiconductor provided in the same layer is used for a semiconductor layer including a channel formation region. Alternatively, the transistors 121 and 123 may be provided in different layers and stacked, in which case the density of semiconductor devices can be further increased.

When the Si transistor and the OS transistors are stacked in the semiconductor device as in FIG. 13, the chip area of the semiconductor device can be reduced.

In FIG. 13, the n-channel transistor 125 is formed on a semiconductor substrate 810. Although not shown in FIG. 13, the transistor 124, the transistors included in the inverter circuit 128, and the transistors included in the memory circuit 110 can be provided in the same layer as the transistor 125.

The semiconductor substrate 810 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 13, a single crystal silicon substrate having n-type conductivity is used.

The transistor 125 is electrically isolated from other transistors existing in the same layer by element isolation insulating films 812. The element isolation insulating films 812 can be formed by a local oxidation of silicon (LOCOS) method, a trench isolation method, or the like.

Specifically, the transistor 125 includes impurity regions 814 and 816 that are formed in the semiconductor substrate 810 and function as source and drain regions, a conductive film 818, and a gate insulating film 820 provided between the semiconductor substrate 810 and the conductive film 818. The conductive film 818 overlaps a channel formation region between the impurity regions 814 and 816 with the gate insulating film 820 positioned between the conductive film 818 and the channel formation region. Note that the conductive film 818 functions as a gate electrode.

An insulating film 822 is provided over the transistor 125. Openings are formed in the insulating film 822. A conductive film 824 in contact with the impurity region 814, a conductive film 826 in contact with the impurity region 816, and a conductive film 828 in contact with the conductive film 818 are formed in the openings. A conductive film 832 is formed in the same layer as the conductive films 824, 826, and 828.

An insulating film 834 is provided over the conductive films 824, 826, 828, and 832. Openings are formed in the insulating film 834. A conductive film 836 that is a wiring in contact with the conductive film 826 and a conductive film 838 in contact with the conductive film 832 are formed in the openings.

In FIG. 13, the transistor 121, the capacitor 122, the transistor 123, and the capacitor 127 are formed over the insulating film 834.

The transistor 121 includes, over the insulating film 834, a semiconductor layer 842 containing an oxide semiconductor, conductive films 848 and 850 that are positioned over the semiconductor layer 842 and function as source and drain electrodes, a gate insulating film 852 over the semiconductor layer 842 and the conductive films 848 and 850, and a conductive film 858 that is positioned over the gate insulating film 852 and overlaps the semiconductor layer 842 between the conductive films 848 and 850. Note that the conductive film 858 functions as a gate electrode.

The capacitor 122 includes, over the insulating film 834, the conductive film 848, the gate insulating film 852 over the conductive film 848, and a conductive film 856 which is over the gate insulating film 852 and part of which overlaps the conductive film 848.

The transistor 123 includes, over the insulating film 834, a semiconductor layer 840 containing an oxide semiconductor, conductive films 844 and 846 that are positioned over the semiconductor layer 840 and function as source and drain electrodes, the gate insulating film 852 over the semiconductor layer 840 and the conductive films 844 and 846, and a conductive film 854 that is positioned over the gate insulating film 852 and has a portion functioning as a gate electrode in a region overlapping the semiconductor layer 840 without overlapping the conductive films 844 and 846. The conductive film 844 is connected to the conductive film 836. The conductive film 846 is connected to the conductive film 838. An opening reaching the conductive film 848 is formed in the gate insulating film 852. A conductive film 854 is provided in the opening.

The capacitor 127 includes, over the insulating film 834, the conductive film 844, the gate insulating film 852 over the conductive film 844, and a conductive film 830 which is over the gate insulating film 852 and part of which overlaps the conductive film 844.

An opening reaching the conductive film 850 is formed in the gate insulating film 852 and an insulating film 860. A conductive film 862 is provided in the opening.

Note that the conductive film 858 serves as a wiring supplied with the write control signal described in Embodiment 1. The conductive film 832 serves as a ground line supplied with the ground potential described in Embodiment 1. The conductive films 848 and 854 serve as wirings corresponding to the node Node_M described in Embodiment 1. The conductive films 826, 836, and 844 serve as wirings corresponding to the node V_C2 described in Embodiment 1. The conductive film 862 serves as a wiring corresponding to the node Node_in described in Embodiment 1.

As the gate insulating films 820 and 852, an inorganic insulating film may be used, for example. The inorganic insulating film preferably has a single-layer or multi-layer structure including any of a silicon nitride film, a silicon oxynitride film, a silicon nitride oxide film, and the like. Providing the gate insulating films 820 and 852 in different layers enables them to have different thicknesses easily. In one embodiment of the present invention, the thickness of the gate insulating film 852 of the transistor 123 is larger than that of the gate insulating film 820 of the transistors 124 and 125 as described in Embodiment 1. This structure can suppress degradation of charge retention characteristics due to gate leakage current of the transistor 123, thereby providing a novel-structured semiconductor device with excellent charge retention characteristics of a node for retaining charge.

Each of the insulating films 822, 834, and 860 is preferably a single layer or a multilayer including an inorganic insulating film or an organic insulating film. The organic insulating film preferably has a single-layer or a multi-layer structure containing polyimide, acrylic, or the like.

The semiconductor layers 840 and 842 are preferably formed using an oxide semiconductor. The oxide semiconductor can be any of the materials described in Embodiment 3.

Each of the conductive films 818, 824, 826, 828, 830, 832, 836, 838, 844, 846, 848, 850, 854, 856, 858, and 862 can be, for example, a single layer or a stack containing a metal material such as aluminum, copper, titanium, tantalum, or tungsten.

In FIG. 13, the transistors 121 and 123 have the gate electrode on at least one side of the semiconductor layer; alternatively, they may have a pair of gate electrodes with the semiconductor layer positioned therebetween.

When the transistors 121 and 123 include a pair of gate electrodes with the semiconductor layer positioned therebetween, one of the gate electrodes may be supplied with a signal for controlling the on/off state, and the other of the gate electrodes may be supplied with a potential from another element. In the latter case, potentials with the same level may be supplied to the pair of gate electrodes, or a fixed potential such as a ground potential may be supplied only to the other of the gate electrodes. When the level of a potential supplied to the other of the gate electrodes is controlled, the threshold voltage of the transistors 121 and 123 can be controlled.

The semiconductor layers 840 and 842 are not limited to a single film of an oxide semiconductor and may be a stack including a plurality of oxide semiconductor films.

The structure described in this embodiment provides a semiconductor device with excellent charge retention characteristics of a node for retaining charge as described in Embodiment 1. Furthermore, with the structure of this embodiment, the increase in the circuit area due to the increase in the number of elements can be prevented, and a semiconductor device with high area efficiency can be provided.

This embodiment can be implemented in appropriate combination with any of the other embodiments.

Embodiment 5

In this embodiment, application examples of the semiconductor device described in the foregoing embodiment to an electronic component and to an electronic device including the electronic component will be described with reference to FIGS. 14A and 14B and FIGS. 15A to 15E.

Figure 14A:
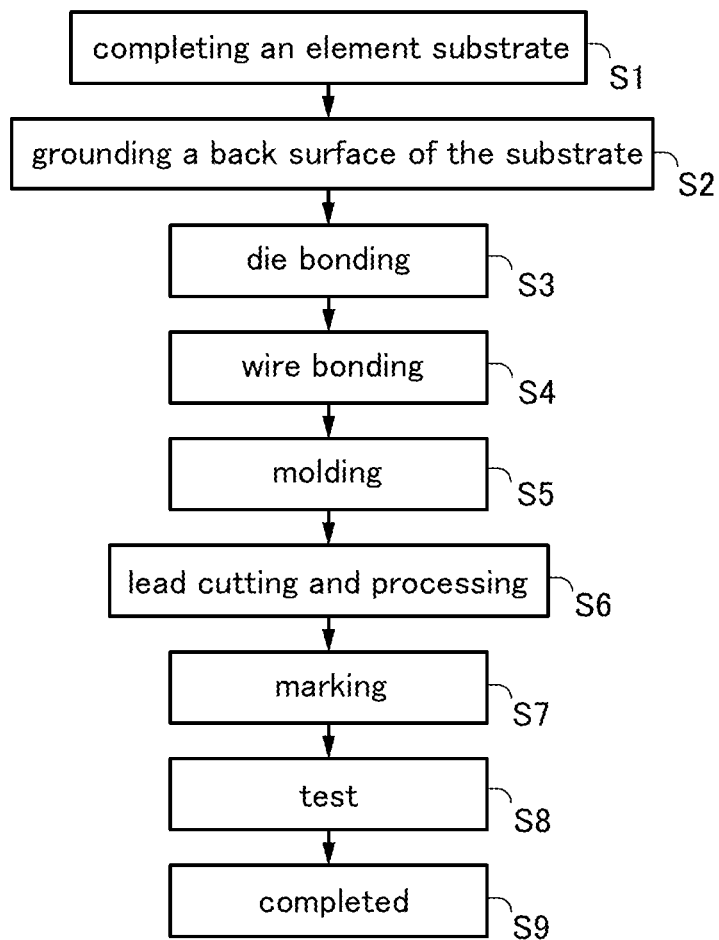
FIG. 14A is a flowchart showing fabrication steps of a semiconductor device.

FIG. 14A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 13 of Embodiment 4 is completed by integrating detachable components on a printed circuit board through the assembly process (post-process).

The post-process can be completed through steps shown in FIG. 14A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the circuit portion and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device of the foregoing embodiment, it is possible to obtain an electronic component including the semiconductor device in which the node for retaining charge has excellent charge retention characteristics. The electronic component has excellent data retention characteristics because it includes the semiconductor device of the foregoing embodiment.

Figure 14B:
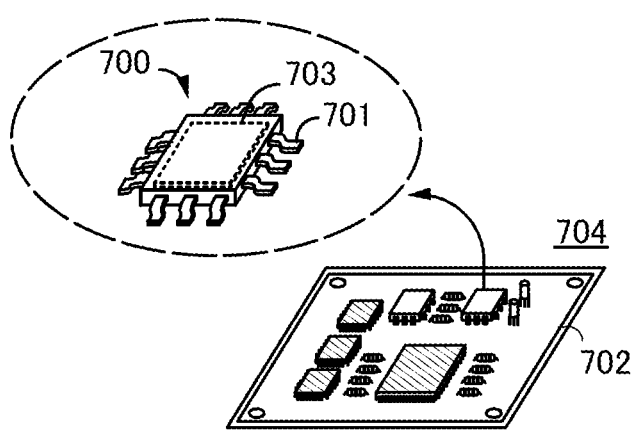
FIG. 14B is a perspective schematic view of the semiconductor device.

FIG. 14B is a perspective schematic diagram of a completed electronic component. FIG. 14B shows a perspective schematic diagram of a quad flat package (QFP) as an example of the electronic component. An electronic component 700 illustrated in FIG. 14B includes a lead 701 and a semiconductor device 703. The electronic component 700 in FIG. 14B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 15A:
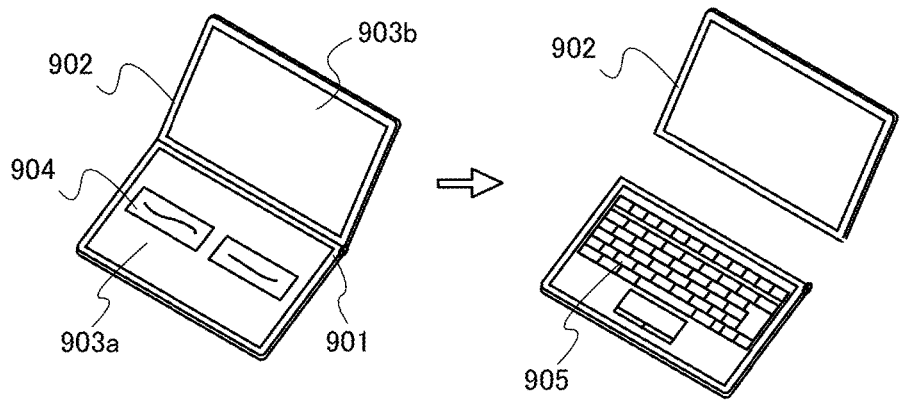
FIGS. 15A to 15E each illustrate an electronic device including a semiconductor device.

FIG. 15A illustrates a portable information appliance that includes a housing 901, a housing 902, a first display portion 903*a*, a second display portion 903*b*, and the like. At least one of the housings 901 and 902 includes the circuit board including the semiconductor device of the foregoing embodiment. Thus, it is possible to obtain a portable information appliance with excellent charge retention characteristics.

Note that the first display portion 903*a* is a panel having a touch input function, and for example, as illustrated in the left of FIG. 15A, which of "touch input" and "keyboard input" is performed can be selected by a selection button 904 displayed on the first display portion 903*a*. Since selection buttons with a variety of sizes can be displayed, the information appliance can be easily used by people of any generation. For example, when "keyboard input" is selected, a keyboard 905 is displayed on the first display portion 903*a* as illustrated in the right of FIG. 15A. Thus, letters can be input quickly by key input as in the case of using a conventional information appliance, for example.

One of the first display portion 903*a* and the second display portion 903*b* can be detached from the portable information appliance as shown in the right of FIG. 15A. Providing the second display portion 903*b* with a touch input function makes the information appliance convenient to carry because the weight can be further reduced and the information appliance can operate with one hand while the other hand supports the housing 902.

The portable information appliance in FIG. 15A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 15A may transmit and receive data wirelessly. Through wireless communication, desired book data or the like can be purchased and downloaded from an e-book server.

In addition, the housing 902 illustrated in FIG. 15A may be equipped with an antenna, a microphone function, or a wireless communication function to be used as a mobile phone.

Figure 15B:
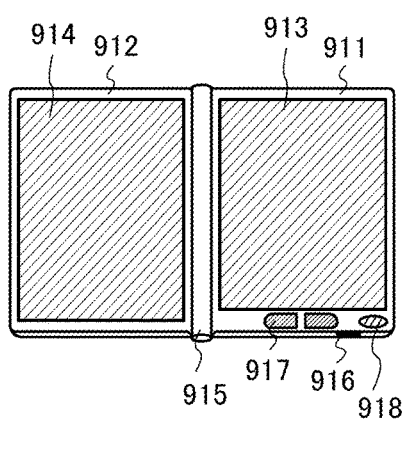

FIG. 15B illustrates an e-book reader in which electronic paper is incorporated. The e-book reader has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The circuit board including the semiconductor device of the foregoing embodiment is provided in at least one of the housings 911 and 912. Consequently, it is possible to obtain an e-book reader with excellent charge retention characteristics.

Figure 15C:
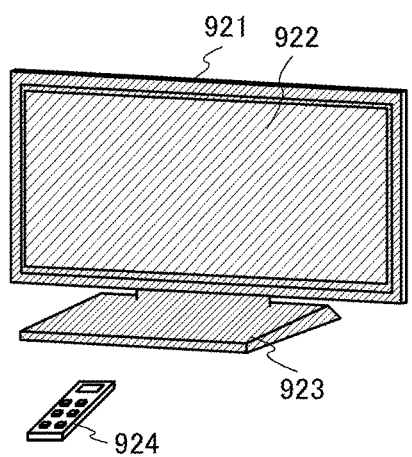

FIG. 15C illustrates a television device including a housing 921, a display portion 922, a stand 923, and the like. The television device can operate with a switch of the housing 921 and a separate remote controller 924. The circuit board including the semiconductor device of the foregoing embodiment is mounted on the housings 921 and the remote controller 924. Thus, it is possible to obtain a television with excellent charge retention characteristics.

Figure 15D:
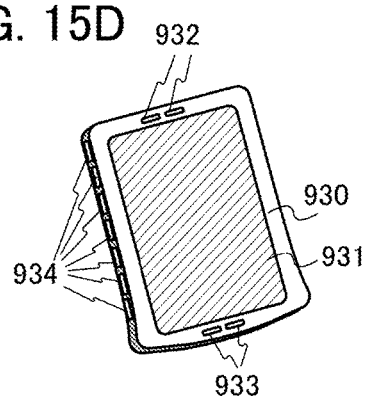

FIG. 15D illustrates a smartphone in which a main body 930 is provided with a display portion 931, a speaker 932, a microphone 933, an operation key 934, and the like. The circuit board including the semiconductor device of the foregoing embodiment is provided in the main body 930. Thus, it is possible to obtain a smartphone with excellent charge retention characteristics.

Figure 15E:
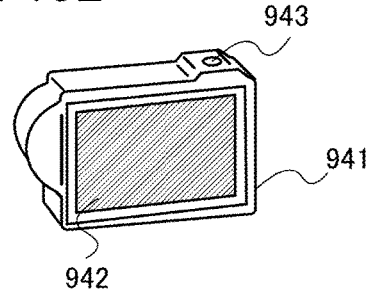

FIG. 15E illustrates a digital camera including a main body 941, a display portion 942, an operation switch 943, and the like. The circuit board including the semiconductor device of the foregoing embodiment is provided in the main body 941. Thus, it is possible to obtain a digital camera with excellent charge retention characteristics.

As described above, the electronic devices shown in this embodiment incorporate the circuit board including the semiconductor device of the foregoing embodiment, thereby having excellent charge retention characteristics.

This application is based on Japanese Patent Application serial No. 2013-169830 filed with Japan Patent Office on Aug. 19, 2013, the entire contents of which are hereby incorporated by reference.

What is claimed is:

1. A semiconductor device comprising:
   a first memory circuit; and
   a second memory circuit comprising:
      a first transistor comprising a first gate, a first source, and a first drain;
      a second transistor comprising a second gate, a second source, and a second drain;
      a third transistor comprising a third gate, a third source, and a third drain;
      a fourth transistor comprising a fourth gate, a fourth source, and a fourth drain;
      a first capacitor comprising a pair of first electrodes; and
      a second capacitor comprising a pair of second electrodes,
   wherein one of the first source and the first drain of the first transistor is electrically connected to a first node,
   wherein the other of the first source and the first drain of the first transistor is electrically connected to a second node,
   wherein the second gate of the second transistor is electrically connected to the second node,
   wherein one of the second source and the second drain of the second transistor is directly connected to one of the pair of the second electrodes of the second capacitor,
   wherein one of the third source and the third drain of the third transistor is electrically connected to one of the fourth source and the fourth drain of the fourth transistor and one of the pair of the first electrodes of the first capacitor,
   wherein the other of the fourth source and the fourth drain of the fourth transistor is directly connected to the one of the second source and the second drain of the second transistor, wherein the other of the fourth source and the fourth drain of the fourth transistor is electrically connected to a third node, and wherein each of the first transistor and the second transistor comprises a channel formation region provided in an oxide semiconductor layer.

2. The semiconductor device according to claim 1, wherein the first memory circuit stores data at the first node and the third node in a period during which a power supply voltage is supplied, wherein the second memory circuit stores the data at the second node when a first control signal is supplied to the first gate of the first transistor, wherein when the data is not read, a second control signal is supplied to the third gate of the third transistor, and the third transistor stores charge in the first capacitor, wherein when the data is read, the fourth transistor distributes the charge stored in the first capacitor to the second capacitor, and wherein when the data is read, the second transistor makes a first potential held in the second capacitor a second potential by inverting logic of the data, in accordance with a potential of the data at the second node.

3. The semiconductor device according to claim 1, wherein a channel formation region of each of the third transistor and the fourth transistor comprises silicon.

4. The semiconductor device according to claim 3, wherein the first transistor and the second transistor are stacked over the third transistor and the fourth transistor.

5. The semiconductor device according to claim 1, wherein each of the third transistor and the fourth transistor comprises a channel formation region provided in an oxide semiconductor layer.

6. The semiconductor device according to claim 1, further comprising a fifth transistor comprising a fifth gate, a fifth source, and a fifth drain, wherein a channel formation region of the fifth transistor comprises silicon, wherein the one of the second source and the second drain of the second transistor is connected to one of the fifth source and the fifth drain of the fifth transistor, and wherein the other of the second source and the second drain of the second transistor is connected to the fifth gate of the fifth transistor.

7. The semiconductor device according to claim 1, wherein each of the first transistor and the second transistor further comprises a backgate electrode.

8. The semiconductor device according to claim 1, further comprising a third capacitor comprising a pair of third electrodes, wherein the other of the first source and the first drain of the first transistor is electrically connected to one of the pair of third electrodes of the third capacitor.

9. The semiconductor device according to claim 2, further comprising a sixth transistor comprising a sixth gate, a sixth source, and a sixth drain, wherein one of the sixth source and the sixth drain of the sixth transistor is electrically connected to the one of the pair of second electrodes of the second capacitor, and wherein the sixth transistor supplies a potential for initializing the second potential held in the second capacitor.

10. The semiconductor device according to claim 1, wherein capacitance of the first capacitor is larger than capacitance of the second capacitor.

11. The semiconductor device according to claim 1, wherein a thickness of a gate insulating film of the second transistor is larger than a thickness of a gate insulating film of the third transistor and the fourth transistor.

12. The semiconductor device according to claim 2, further comprising an inverter circuit that inverts the second potential held in the second capacitor and supplies an inverted potential to the third node.

13. The semiconductor device according to claim 1, wherein the one of the pair of the second electrodes of the second capacitor is electrically connected to the other of the fourth source and the fourth drain of the fourth transistor without the second transistor.

14. A semiconductor device comprising:
a first memory circuit; and
a second memory circuit comprising:
    a first transistor comprising a first gate, a first source, and a first drain;
    a second transistor comprising a second gate, a second source, and a second drain;
    a third transistor comprising a third gate, a third source, and a third drain;
    a first capacitor comprising a pair of first electrodes; and
    a second capacitor comprising a pair of second electrodes, wherein one of the first source and the first drain of the first transistor is electrically connected to a first node and one of the pair of the first electrodes of the first capacitor, wherein the other of the first source and the first drain of the first transistor is electrically connected to a second node, wherein the second gate of the second transistor is electrically connected to the first node, wherein one of the second source and the second drain of the second transistor is directly connected to one of the third source and the third drain of the third transistor and one of the pair of the second electrodes of the second capacitor, wherein the one of the third source and the third drain of the third transistor is electrically connected to a third node, wherein the first memory circuit stores data at the second node and the third node in a period during which a power supply voltage is supplied, and wherein each of the first transistor and the second transistor comprises a channel formation region provided in an oxide semiconductor layer.

15. The semiconductor device according to claim 14, wherein each of the first transistor and the second transistor comprises a backgate electrode.

16. The semiconductor device according to claim 14, wherein the second memory circuit stores the data at the first node when a control signal is supplied to the first gate of the first transistor.

* * * * *